United States Patent [19]
Leach

[11] Patent Number: 5,637,892
[45] Date of Patent: Jun. 10, 1997

[54] ELECTROSTATIC DISCHARGE PROTECTION IN INTEGRATED CIRCUITS, SYSTEMS AND METHODS

[75] Inventor: Jerald G. Leach, Houston, Tex.

[73] Assignee: Texas Instruments Incorporated, Dallas, Tex.

[21] Appl. No.: 475,159

[22] Filed: Jun. 7, 1995

Related U.S. Application Data

[62] Division of Ser. No. 178,722, Jan. 10, 1994, which is a division of Ser. No. 948,074, Sep. 21, 1992, Pat. No. 5,290,724, which is a continuation of Ser. No. 677,028, Mar. 28, 1991, abandoned.

[51] Int. Cl.⁶ ........................................ H01L 23/62
[52] U.S. Cl. ............... 257/362; 257/357; 257/133; 257/173; 257/162; 257/358; 257/154; 257/146; 361/101; 327/428
[58] Field of Search ........................ 257/567, 568, 257/569, 207, 173, 546, 355, 362, 357, 133, 162, 358, 154, 146; 361/101; 327/428

[56] References Cited

U.S. PATENT DOCUMENTS

| | | |
|---|---|---|
| 2,655,610 | 10/1953 | Ebers . |
| 4,117,507 | 9/1978 | Pacor . |
| 4,282,555 | 8/1981 | Svedberg . |
| 4,302,875 | 12/1981 | Satou et al. ............... 29/571 |
| 4,400,711 | 8/1983 | Avery ...................... 257/173 |
| 4,484,244 | 11/1984 | Avery . |
| 4,500,845 | 2/1985 | Ehni . |
| 4,602,267 | 7/1986 | Shirato ..................... 257/361 |
| 4,605,872 | 8/1986 | Rung . |
| 4,626,882 | 12/1986 | Cottrell et al. . |
| 4,630,162 | 12/1986 | Bell et al. . |
| 4,692,781 | 9/1987 | Rountree et al. . |
| 4,760,433 | 7/1988 | Young et al. . |
| 4,808,861 | 2/1989 | Ehni . |
| 4,821,096 | 4/1989 | Maloney . |
| 4,855,620 | 8/1989 | Duvvury et al. . |
| 4,896,243 | 1/1990 | Chatterjee et al. . |
| 4,922,371 | 5/1990 | Gray et al. . |
| 4,928,023 | 5/1990 | Marshall . |
| 4,937,639 | 6/1990 | Yao et al. . |
| 4,939,616 | 7/1990 | Rountree . |
| 5,008,724 | 4/1991 | Shirai et al. . |

(List continued on next page.)

FOREIGN PATENT DOCUMENTS

| | | | |
|---|---|---|---|
| 0255125 | 2/1988 | European Pat. Off. | ............. 257/355 |
| 2336287 | 2/1975 | Germany . | |
| 273722A | 11/1989 | Germany . | |
| 60-253258 | 12/1985 | Japan | ................ 257/546 |
| 2-90669 | 3/1990 | Japan | ................ 257/355 |
| 2182491 | 5/1987 | United Kingdom | ........... 257/546 |

OTHER PUBLICATIONS

IBM Technical Disclosure Bulletin, "Chip Encircling Electrostatic Protection" vol. 33, No. 9, Feb. 1991, pp. 5–6.

(List continued on next page.)

Primary Examiner—Jerome Jackson, Jr.
Assistant Examiner—John Guay
Attorney, Agent, or Firm—Gerald E. Laws; C. Alan McClure; James C. Kesterson

[57] ABSTRACT

An integrated circuit has a semiconductor die with a substrate and at least first and second bond pads. An internal circuit is fabricated on the semiconductor die and connected to the first bond pad. An electrostatic discharge protection circuit including cascaded bipolar transistors is connected in series with a field effect transistor between the first and second bond pads. In another version, an output buffer of the integrated circuit is divided into sections. An electrostatic discharge protection circuit is triggerable in response to a voltage in the substrate. Resistive connections are provided from the sections of the output buffer to one of the bond pads. The output buffer is operative upon an electrostatic discharge event to inject sufficient charge into the substrate to produce the voltage to trigger the electrostatic discharge protection circuit. Other circuits, devices, systems and methods are also disclosed.

19 Claims, 21 Drawing Sheets

U.S. PATENT DOCUMENTS

| | | |
|---|---|---|
| 5,012,317 | 4/1991 | Rountree. |
| 5,019,888 | 5/1991 | Scott et al.. |
| 5,036,215 | 7/1991 | Masleid et al.. |
| 5,060,037 | 10/1991 | Rountree. |
| 5,072,273 | 12/1991 | Avery. |
| 5,077,591 | 12/1991 | Chen et al.. |
| 5,083,181 | 1/1992 | Yoshida et al. .......................... 257/207 |
| 5,140,401 | 8/1992 | Ker et al. ................................ 257/357 |
| 5,465,189 | 11/1995 | Polgreen et al. ........................ 257/357 |

OTHER PUBLICATIONS

IBM Technical Disclosure Bulletin; "Cascaded Electrostatic Discharge Protection Structure," vol. 30, No. 8, Jan. 1988, pp. 389–390.

Avery, L.R., *Using SCR's As Transient Protection Structures In Integrated Circuits*, RCA DSRC, Princeton, NJ, pp. 177–180. no date.

Lin, C.M., et al. *A CMOS VLSI ESD Input Protection Device, DIFIDW*, EOS/ESD Symposium Proceedings, 1984, pp. 202–209. no month.

Pribyl, W., et al., *CMOS Output Buffers for Megabit DRAM's*, IEEE Journal of Solid–State Circuits, Special Correspondence, vol. 23, No. 3, Jun. 1988, pp. 816–819.

Reczek, W., et al., *Reliability of Latch–Up Characterization Procedures*, Proc. IEEE 1990 Int'l. Conference on Microelectronic Test Structures, vol. 3, Mar. 1990, pp. 51–54. no month.

Reczek, W., et al., *Latch–Up Free CMOS Using Buried Polysilicon Diodes*, Siemens AG, Corporate Research and Development, Otto–Hahn–Ring 6, D–8000 Munich 83, FRG, pp. 679–682. no date.

Rountree, R.N., *A Process–Tolerant Input Protection Circuit for Advanced CMOS Processes*, Texas Instruments Incorporated, 1988 EOS/ESD Symposium. no date.

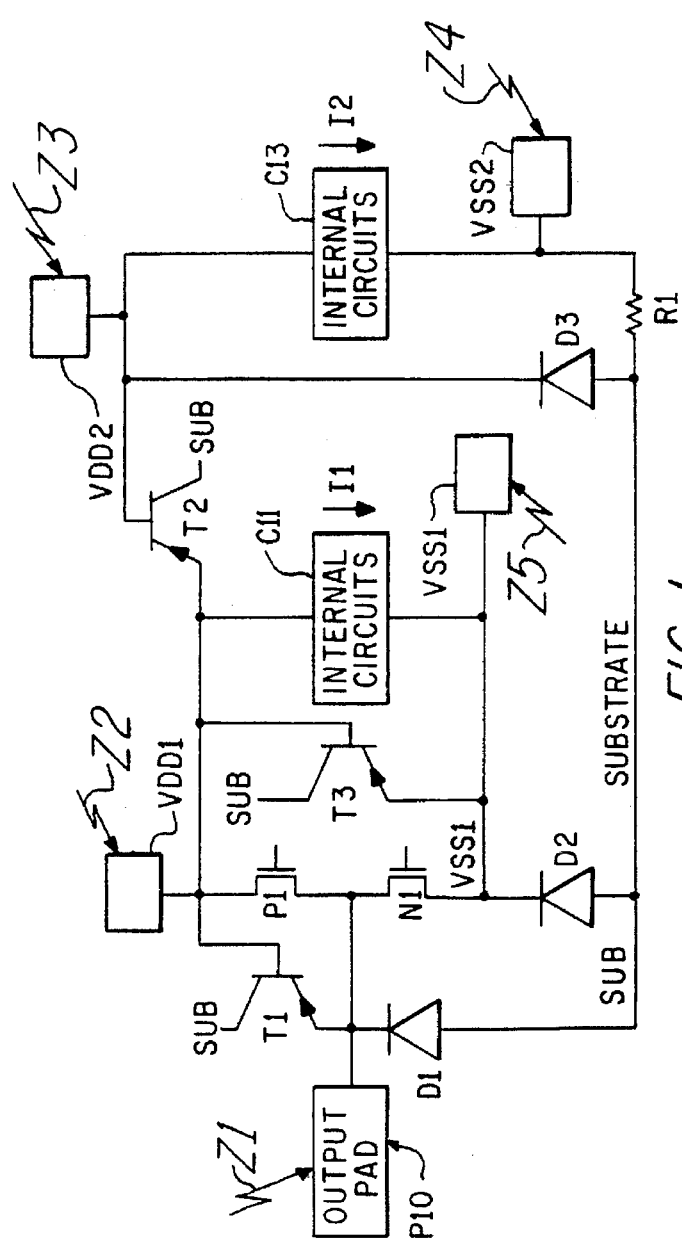
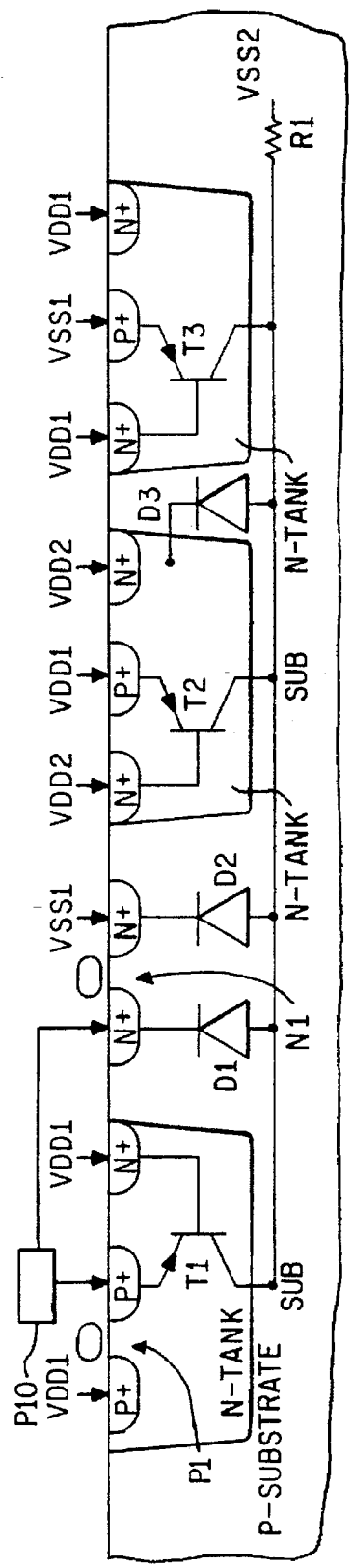
FIG. 1
FIG. 2

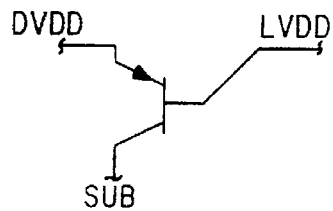
FIG. 9a
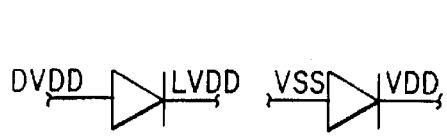
FIG. 9b    FIG. 10
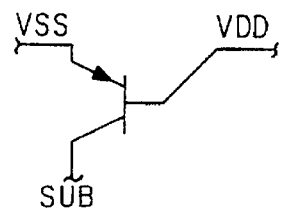
FIG. 11
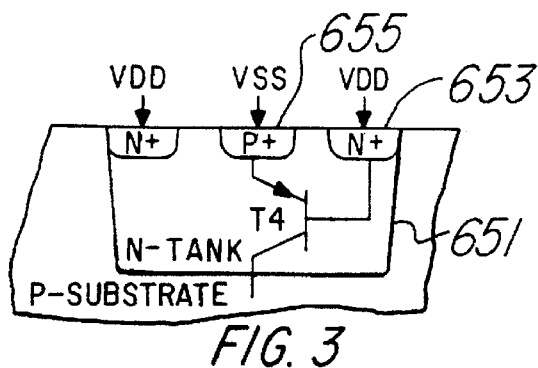
FIG. 3
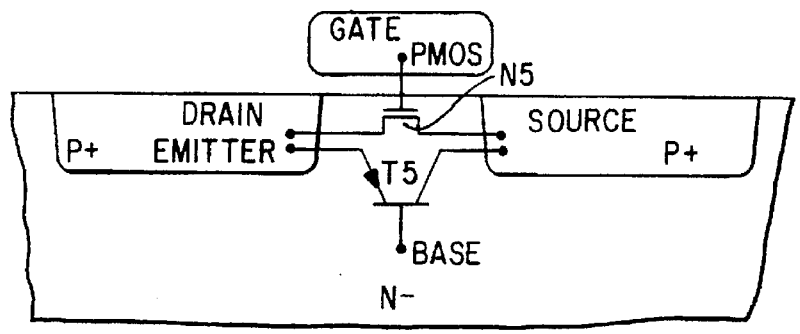
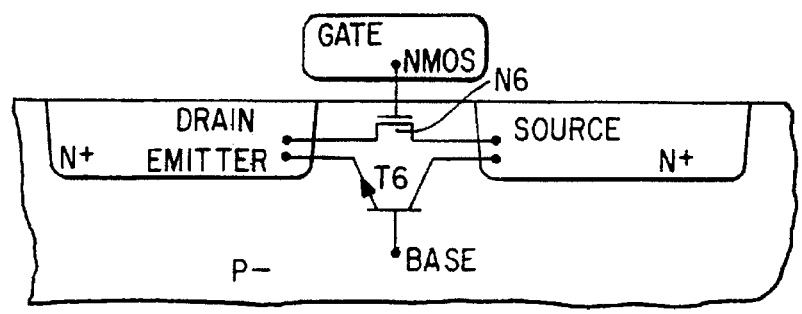
FIG. 4

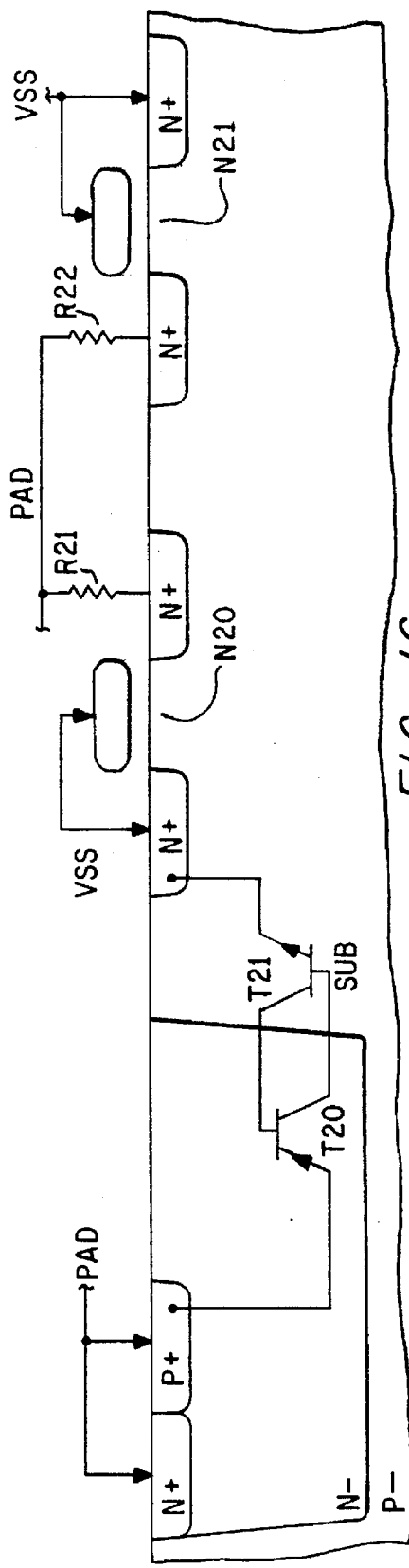
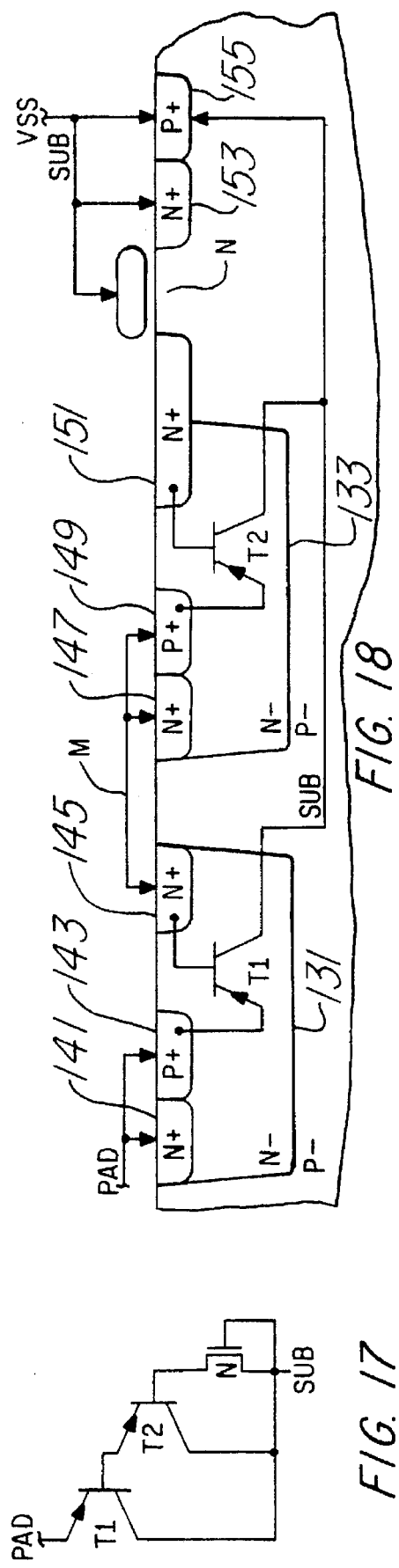
FIG. 16
FIG. 17
FIG. 18

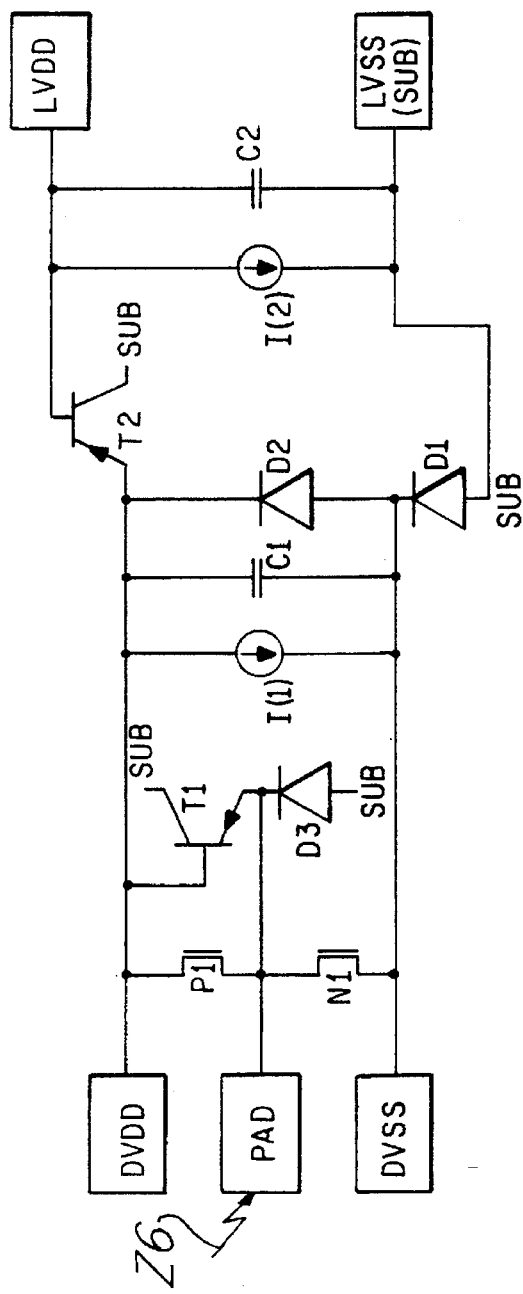
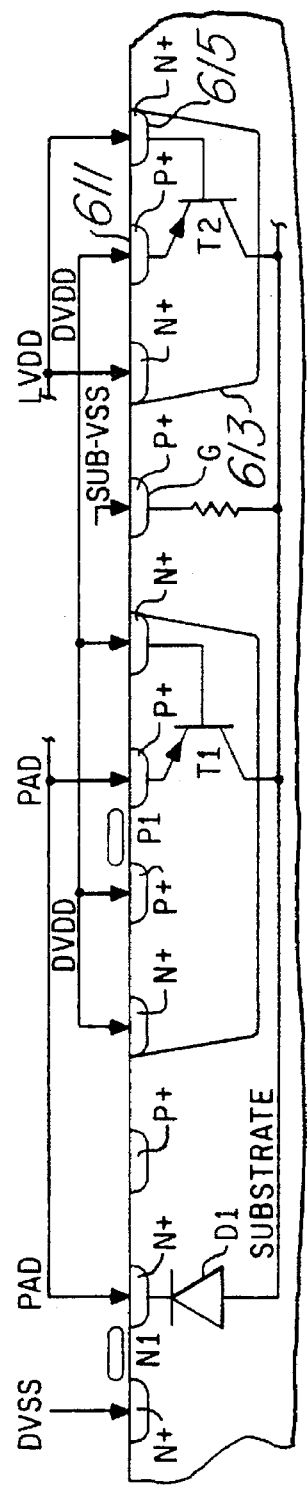
FIG. 19
FIG. 20

ELECTROSTATIC DISCHARGE PROTECTION IN INTEGRATED CIRCUITS, SYSTEMS AND METHODS

This is a division of application Ser. No. 08/178,722, filed Jan. 10, 1994, a divisional of prior application Ser. No. 07/948,074, filed Sep. 21, 1992, and now U.S. Pat. No. 5,290,724, which is a continuation of application Ser. No. 07/677,028, filed Mar. 28, 1991, now abandoned.

NOTICE

A portion of the disclosure of this patent document contains material which is subject to mask work protection. The mask work owner has no objection to the facsimile reproduction by anyone of the patent document or the patent disclosure, as it appears in the Patent and Trademark Office patent file or records, but otherwise reserves all mask work rights whatsoever.

CROSS-REFERENCE TO RELATED APPLICATIONS

The following coassigned patent application and patents are hereby incorporated herein by reference:

| Serial No. | Filing Date | TI Case No. |
| --- | --- | --- |
| 488,590 | 03/05/90 | TI-14246, Abandoned |
| 08/104,281 | 08/10/93 | TI-14246A, Abandoned |
| 08/289,983 | 08/12/94 | TI-14246B, Pending. |
| U.S. Pat. No. | | |
| 4,630,162 | | TI-10476 |
| 4,692,781 | | TI-10508 |
| 4,855,620 | | TI-12845 |
| 4,896,243 | | TI-13548 |
| 4,928,023 | | TI-12607 |
| 4,939,616 | | TI-13141A |
| 5,012,317 | | TI-11444B |
| 5,060,037 | | TI-12011B |

FIELD OF THE INVENTION

This invention generally relates to electrostatic discharge protection circuits, and improvements for such protection in integrated circuits, systems and methods for making.

BACKGROUND OF THE INVENTION

Electrostatic discharge (ESD) protection circuitry is an essential part of modern integrated circuits. Extremely small delicate device structures are very sensitive to the high voltages which may be generated by contact with the electrostatic charge developed by the human body. During installation of integrated circuits into products, these electrostatic discharges may destroy integrated circuits (ICs) and thus require expensive and tedious repairs on fully manufactured devices which could have been avoided by providing a mechanism for dissipation of the electrostatic discharge to which the IC may be subjected. This problem is particularly acute in complementary metal oxide semiconductor field effect transistor (CMOS) type integrated circuits. In high density CMOS devices, an extremely high voltage may be developed by electrostatic discharge which easily destroys the very thin gate oxides and very short channel devices of the integrated circuit.

To protect against these overvoltage conditions it has been proposed that a silicon controlled rectifier (SCR) structure compatible with CMOS processing be utilized. One such structure is shown in coassigned application Ser. No. 213, 499, filed Jun. 27, 1988 (TI-11444B). Other SCR structures are shown in coassigned U.S. Pat. No. 4,896,243 (TI-13548) and U.S. Pat. No. 4,939,616 (TI-13141A).

ESD protection for MOS output buffers has typically relied on a parasitic lateral bipolar transistor of the MOS devices. When the voltage reaches the breakdown voltage of the devices, the lateral transistors should turn on and clamp the pad voltage at a sufficiently low voltage to protect the output buffer. The devices typically have a snap-back characteristic during breakdown. The parasitic transistor triggers at a high voltage and snaps-back to a lower voltage to clamp the pad voltage. However, a portion of the MOS device can trigger and snap-back to a lower voltage and conduct all of the current. When this happens, this part can be destroyed before the voltage rises high enough to trigger the rest of the device. This is especially a problem for devices with low resistance substrates, since the substrate is the base of the parasitic lateral transistors and the base is difficult to forward bias if it is low resistance. Low resistance substrates are desirably used on CMOS circuits to prevent latchup of parasitic SCRs in normal operation, however. This conflicts with the use of SCRs for ESD protection.

Because of the importance of ESD protection, it is desirable to improve and provide alternative ESD protection circuits. Desirable improvements include those which are particularly adaptable for CMOS circuits with low resistance substrates.

SUMMARY OF THE INVENTION

Generally, and in one form of the invention, an integrated circuit has a semiconductor die with a substrate and at least first and second bond pads. An internal circuit is fabricated on the semiconductor die and connected to the first bond pad. An electrostatic discharge protection circuit including cascaded bipolar transistors is connected in series with a field effect transistor between the first and second bond pads.

Generally, and in another form of the invention, an integrated circuit has a substrate with bond pads. An output buffer is divided into sections. An electrostatic discharge protection circuit is triggerable in response to a voltage in the substrate. Resistive connections are provided from the sections of the output buffer to one of the bond pads. The output buffer is operative upon an electrostatic discharge event to inject sufficient charge into the substrate to produce the voltage to trigger the electrostatic discharge protection circuit.

Other integrated circuits, ESD circuits, systems and methods are disclosed and claimed.

BRIEF DESCRIPTION OF THE DRAWINGS

In the drawings:

FIG. 1 is a schematic diagram of an integrated circuit with improved ESD protection;

FIG. 2 is a cross section diagram of part of the integrated circuit of FIG. 1;

FIG. 3 is a cross section of a transistor used to protect logic between VDD and VSS, if VSS is zapped positive and VDD grounded;

FIG. 4 shows cross sections of NMOS and PMOS devices with their parasitic lateral bipolar transistors;

FIGS. 9a, 9b, 10 and 11 are schematic diagrams showing devices and connections for further ESD protection;

FIG. 16 is a cross-sectional physical view of part of the circuit of FIG. 15;

FIG. 17 is a schematic diagram of a cascaded transistor ESD circuit;

FIG. 18 is a cross-sectional view of the circuit of FIG. 17;

FIG. 19 is a schematic diagram of another integrated circuit provided with ESD protection;

FIG. 20 is a cross-sectional view of part of an integrated circuit improved for ESD protection;

Corresponding numerals and symbols in the different figures refer to corresponding parts unless otherwise indicated.

DETAILED DESCRIPTION OF PREFERRED EMBODIMENTS

Figure 5:
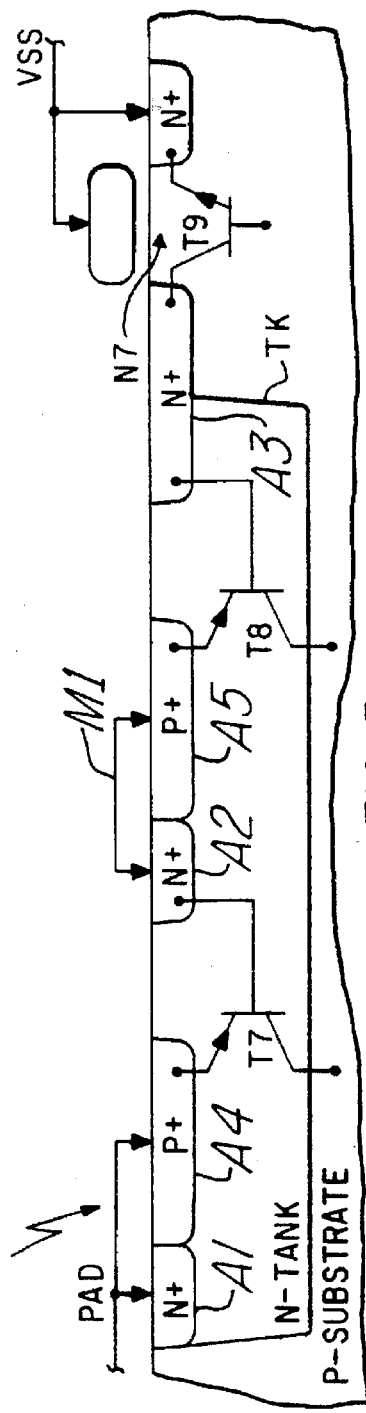
FIG. 5 is a cross section of an NMOS device driving cascaded bipolar devices in another improved ESD protection approach.

FIGS. 1 and 2 show an integrated circuit having a semiconductor die with a substrate. Various bond pads VSS1, VSS2, VDD1 and VDD2 for supply voltage and an output bond pad P10 are indicated by rectangles. A CMOS output buffer has serially connected p-channel field effect transistor FET P1 and n-channel FET N1 between VDD1 and VSS1. The integrated circuit also has internal circuits C11 and C13. Circuit C11 is connected between VDD1 and VSS1. Circuit C13 is connected between VDD2 and VSS2. Multiple voltage supply pads such as VSS1, VDD1 and VSS2, VDD2 are used to prevent interference to one circuit from current spikes due to switching in another circuit. A high current circuit such as a buffer is connected to what is sometimes called "dirty" VSS and VDD (or DVSS and DVDD also called VSS1 and VDD1 herein) which are distinct from "clean" or "logic" LVSS and LVDD (also called VSS2 and VDD2 or VSSL and VDDL herein). An output buffer is described in coassigned U.S. Pat. No. 4,928,023 issued May 22, 1990 which is hereby incorporated herein by reference, and further describes dirty, clean, noisy and quiet lines.

The output buffer and circuits C11 and C13 are advantageously improved and protected from an ESD (electrostatic discharge) event Z1–Z5 to any of the bond pads or pins of the chip by the provision of transistors T1, T2, and T3 and diodes D1, D2 and D3. A resistance R1 represents a resistance of the substrate.

An ESD event is called a "zap" herein because some ESD causes a pulse, spark or sound which the word "zap" concisely represents. ESD zaps can occur from static electricity discharges from persons installing or removing an integrated circuit chip. Also, any sudden discharge or other undesirable potential difference applied to the chip due to a surge in an industrial, office, home or field environment can be an ESD event of interest herein.

Before an ESD zap, the bond pads for VDD1 and VDD2 in FIG. 1 are initially at 0 volts due to substrate leakage currents. If the output pad P10 is zapped positive by zap Z1 with VSS1 as reference, transistor T1 turns on as its emitter-base diode to VDD1 is forward biased. Most of the current goes to substrate SUB and the rest goes to VDD1, raising the voltage on VDD1. When and if VDD1 goes positive, transistor T2 turns on as its emitter-base diode to VDD2 is forward biased. Most of the current goes to substrate and the rest goes to VDD2, raising the voltage on VDD2 harmlessly.

If the BVDSS breakdown of the NMOS output device N1 of FIG. 1 is 10 V, the voltage on VDD1 would reach 10 V minus a diode drop and VDD2 would reach 10 V minus 2 diode drops before the NMOS device N1 would be damaged by BVDSS breakdown. VSS2 is clamped a diode drop more positive than VSS1 by diode D2.

A current I1 is the VDD1 to VSS1 current during initial power up of the circuit. Current I1 is the combination of currents generated by nodes switching, floating inputs creating DC current through logic gates, possible bus conflicts due to being uninitialized, charging of parasitic capacitances, and other DC or AC current internal to the circuit. A current I2 is the current VDD2 to VSS2 during initial power up. Current I1 is amplified by transistor T1, and current I2 is amplified by transistor T1 cascaded with transistor T2.

Generally, the combination of current I1 amplified by transistor T1 plus current I2 amplified by transistor T1 cascaded with transistor T2, should be large enough to give good ESD performance. If this is not the case, transistor T1 or transistor T2 can be cascaded with additional transistors to give greater gain to current I1 and current I2 and even better ESD performance. An example of cascaded transistors is shown in FIG. 5 as well as FIG. 18.

Connections in FIG. 1 are indicated by corresponding bond pad designations without showing metal or other conductive paths. If the output pad P10 is taken as a reference and VSS1 zapped positive by zap Z5, transistor T3 turns on with most of the current going to substrate and the rest to VDD1. When VDD1 goes positive transistor T2 turns on with most of the current going to substrate and the rest going to VDD2. VSS2 is clamped a diode drop more positive than the output pad P10 by D1. Current I1 is amplified by transistor T3, and current I2 is amplified by transistor T2 cascaded with transistor T3. As a result buffer n-channel FET N1 is protected from ESD zaps.

If VDD1 is reference and the output pad P10 be zapped positive, transistor T1 turns on protecting buffer p-channel FET P1.

If the output pad is reference and VDD1 zapped positive by zap Z2, transistor T2 turns on with most of the current going to substrate and the rest going to VDD2. VSS2 is clamped a diode drop more positive than the output pad by diode D1. As a result current I2 is amplified by transistor T2, protecting p-channel P1 from ESD zaps.

In an uncomplicated alternative embodiment, it is possible to use diodes in place of transistor T1, transistor T2 or transistor T3. The ESD protection is decreased since transistor T1, transistor T2 and transistor T3 amplify current I1 and current I2.

Input pads of an integrated circuit are also protected from ESD in a similar manner to that described above.

Circuit C11 connected between VDD1 and VSS1 is also protected by the ESD circuit described above. If VDD1 is reference and VSS1 is zapped positive by zap Z5, transistor T3 turns on and shunts the current, protecting the circuits between VDD1 and VSS1.

If VSS1 is reference and VDD1 zapped positive zap Z2, transistor T2 turns on and amplifies current I2. Transistor T2 sinks the current, protecting the circuits between VDD1 and VSS1. As a result the ESD protection is improved.

Diodes D1, D2 and D3 complete ESD paths upon a zap Z4 so that the substrate can dissipate the ESD energy.

A diode or bipolar transistor can be connected between each VSS and VDD as in FIG. 3, to forward bias when any VSS is zapped positive and VDD grounded. The diode or bipolar transistor shunts the ESD current, protecting internal circuits. This improvement is particularly useful for internal circuits on devices where one or more VSS's are not connected to substrate, (due to multiple VSS's or floating substrates) to prevent any damage when any VSS is zapped positive and VDD grounded.

NMOS and PMOS transistors respectively have a NPN or PNP parasitic bipolar transistor across their source and drain as shown in FIG. 4. These parasitic transistors typically have shallow junctions and are not optimized for large power dissipation, as is desirable to dissipate ESD zaps.

In the improvement of FIG. 5, vertical PNP transistors located inside one or more tanks (transistor T7 and transistor T8 of FIG. 5) have a large surface area to dissipate energy, and are more suited for ESD protection. Note that symbols added for transistors T7 and T8 represent equivalent transistors of the illustrated structure. However, the transistors do not go into BVDSS breakdown at a low enough voltage to protect MOS circuits. By adding a MOSFET device N7 so that ESD triggers its parasitic NPN transistor T9, and amplifying this current through the vertical PNP transistors T7 and T8, the vertical transistors dissipate most of the energy and the ESD performance is improved. Note that the conductivity types can be reversed, so that a p-channel FET would have cascaded NPN vertical transistors in another embodiment.

In the FIG. 5 cross section n-channel FET N7 is a NMOS transistor used to trigger its lateral parasitic NPN transistor T9. The collector of transistor T9 drives the base of vertical transistor T8. Transistor T8 amplifies the current and dissipates energy across its junction area. The emitter of transistor T8 drives the base of transistor T7. Transistor T7 amplifies the current of transistor T8 and dissipates energy across its junction area also.

As a result the current through parasitic transistor T9 of FET N7 is amplified by transistor T8 cascaded with transistor T7, and most of the energy is dissipated in transistor T7 and transistor T8. This circuit can be used to protect inputs, outputs and internal logic connected to power supplies. FET N7 thus is a field effect transistor having a n+ source and drain provided on the substrate, each of opposite conductivity type from the p– substrate. The n– tank TK has opposite conductivity type from the substrate also and is provided on the substrate as shown in FIG. 5.

First, second and third n+ regions A1, A2, A3 are provided to tank TK and have the same conductivity type as tank TK and greater conductivity than tank TK. Fourth and fifth p+ regions A4 and A5 are provided to the tank and have opposite conductivity type to the tank. The fourth and fifth regions A4 and A5 act as transistor emitters, and the second and third regions A2 and A3 act as transistor base connections for vertical transistors T7 and T8 respectively. The substrate acts as a collector for the emitters. The first region A1 and fourth region A4 are connected to a bond pad such as P10, and second region A2 and fifth region A5 are connected to each other, such as by metal M1. The third region A3 crosses the tank boundary and joins to field effect transistor N7. Field effect transistor N7 is further connected to bond pad VSS for ESD operation.

Turning to another embodiment of ESD protection circuitry, SCRs can be used for ESD protection of inputs, and internal logic as well as output buffers. For background, see coassigned patent application Ser. No. 488,590, filed Mar. 5, 1990, now abandoned/combined into Continuation 1.62 Ser. No. 08/104,281, filed Aug. 10, 1993 (TI-14246A) now abandoned/combined into currently pending patent application Ser. No. 08/289,983 filed Aug. 12, 1994 (TI-14246B) for "Low Voltage Triggering SCR for ESD Protection", which is hereby incorporated herein by reference. Improved FET circuitry is used to trigger an SCR herein, and a sufficient voltage for triggering the SCR is desirable. As integrated circuit processing advances to smaller dimensions, the resistance of the substrate decreases and makes it harder to ESD trigger an SCR. Also, low resistance substrates are used on CMOS circuits to desirably prevent latchup of parasitic SCR's in normal operation. However, this important goal conflicts with the ESD protection goal. Circuits and layouts of embodiments described herein substantially reduce the constraining influence of substrate resistance on ESD protection.

Figure 6:
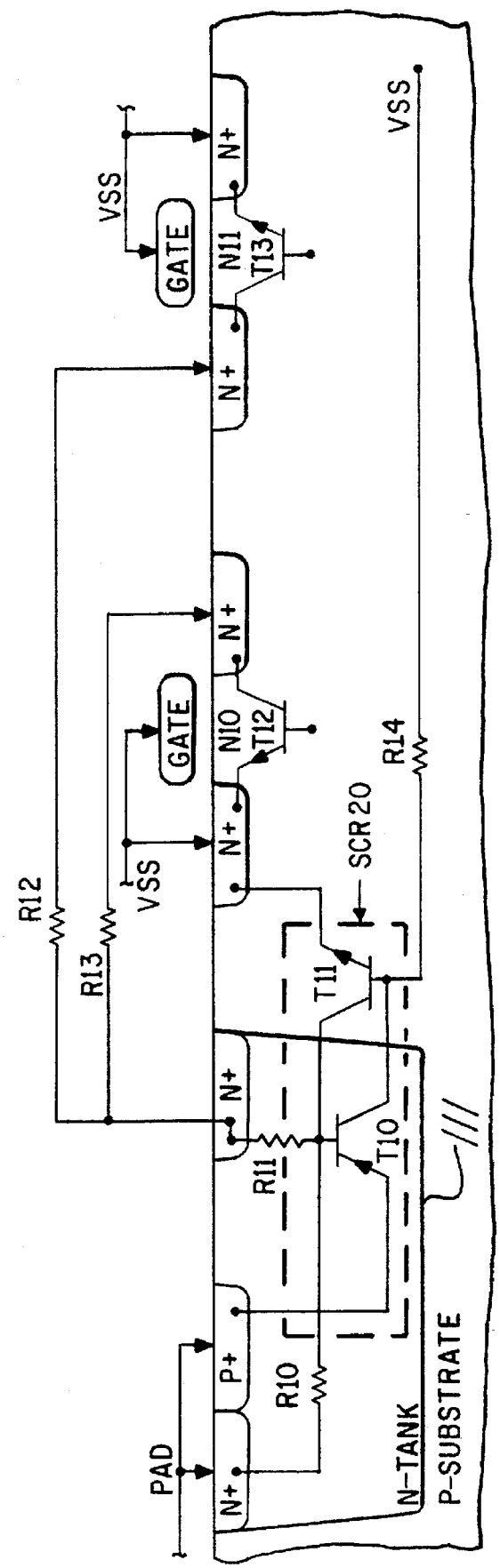
FIG. 6 is a cross section and partly electrical schematic diagram of multiple NMOS devices protected by resistors used to trigger an SCR in another improved ESD protection approach.
Figure 7:
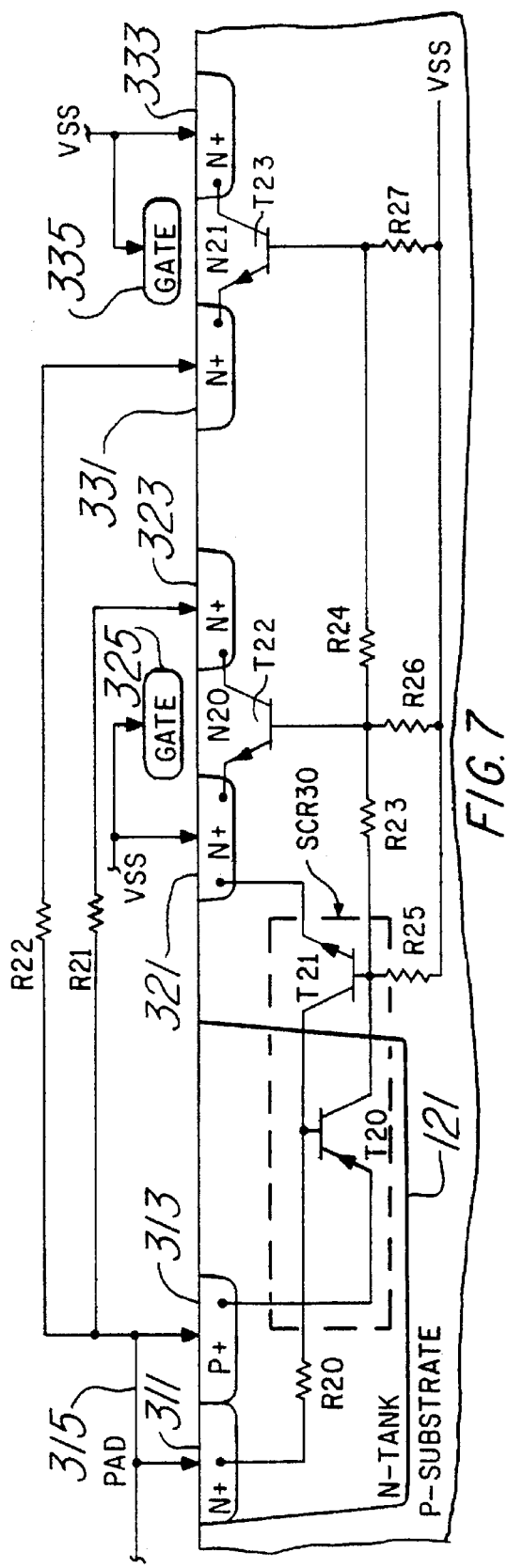
FIG. 7 is a cross section and partly electrical schematic diagram of another ESD protection example of multiple NMOS devices protected by resistors used to trigger an SCR.

FIGS. 6 and 7 show respective SCR-connected and bond-pad-connected approaches to improvements providing multiple-resistance and sectioned FET circuitry for ESD protection.

Figure 8:
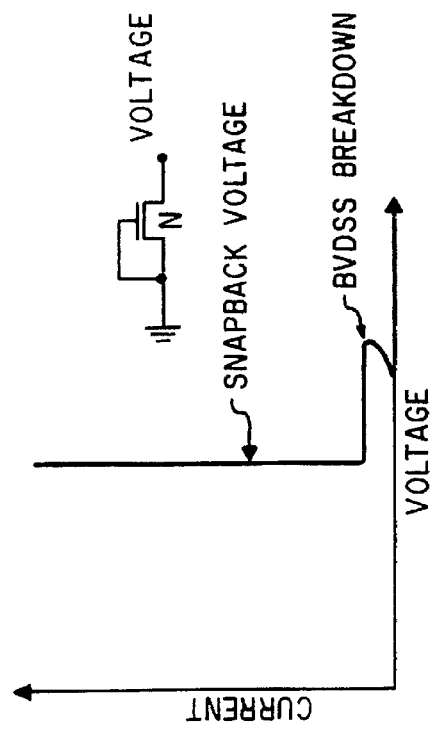
FIG. 8 is a graph of current versus voltage that illustrates a BVDSS breakdown characteristic of an NMOS device.

As shown in FIG. 8, NMOS devices N10 and N11 of FIG. 6 and N20 and N21 of FIG. 7 have a snap back characteristic during BVDSS breakdown. The parasitic NPN bipolar transistor of the NMOS device triggers at a high voltage and snaps back to a lower voltage to clamp the voltage.

However, in the microscopic physical reality of the NMOS (or PMOS) FET, part of the NMOS can break down at a lower voltage than the rest of it, and snap back to a lower voltage, conducting all of the current. When this happens, this conducting part of the NMOS can be destroyed before the voltage rises high enough to trigger the rest of the device. This is especially a problem for devices with low resistance substrates. The substrate is the base of each parasitic lateral NPN and the base is more difficult to forward bias with a low resistance substrate.

In FIGS. 6, 7, and 12–16, the problem is solved by breaking the NMOS (or PMOS) device into sections and using a resistor to protect each section. In this way, the current is limited through each section. When a section of the NMOS device goes into BVDSS breakdown and conducts current, the voltage drop across the resistor allows the voltage to rise sufficiently for the rest of the device to trigger, spreading the current through all of the sections. As a result, a larger current can be generated to trigger a SCR without damaging the NMOS sections or devices, which is especially advantageous when they have been made on a low impedance substrate with thin epi beneath the n-tank. In this improvement sectioning the n-channel device to provide multiple n-channel devices and connecting them with multiple resistors current balances the n-channel devices and provides more current into the SCR to trigger it.

Figure 12:
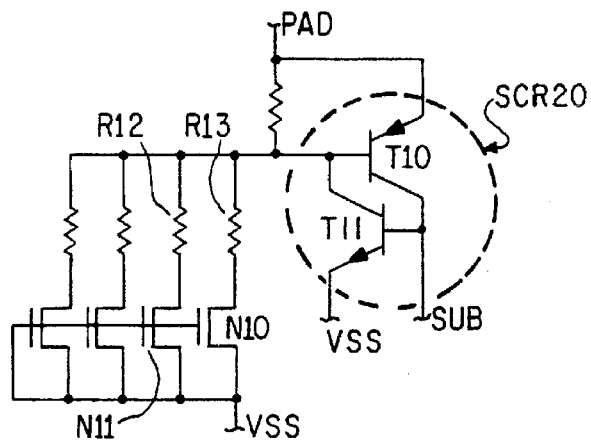
FIGS. 12 and 13 are schematic diagrams of two improved ESD circuits using a sectioned FET and multiple resistors.
Figure 13:
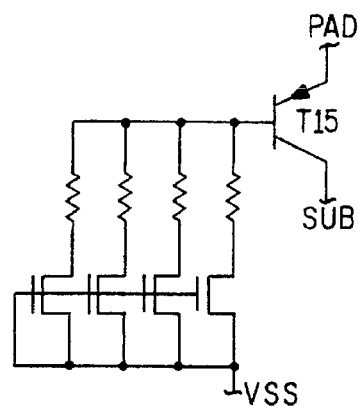
Figure 15:
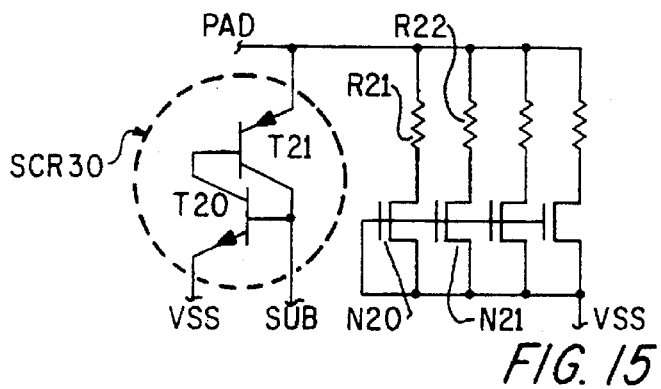
FIG. 15 is a schematic diagram of another sectioned FET, multiple resistor approach to ESD protection.

In FIGS. 12, 13 and 15, four FET transistors with respective added resistors, section the n-channel device. FIGS. 6, 7 and 16 show two FET transistor sections which are also representative of embodiments with more than two FET sections.

Each resistor has a resistance value which is provided to limit current to a value which does not burn out the protected device or circuitry. For the process used, a rule of thumb establishes an ESD voltage protection value of 4 volts per micron of width of an n-channel device. Thus a 250 micron n-channel provides about one kilovolt of ESD. A current-handling rule of thumb is about 2.7 milliamperes per micron of n-channel width. Thus a 60 micron wide n-channel should be limited to a current of about 162 milliamperes. The rules of thumb of the particular process with which the skilled worker is involved are suitably substituted for the values used in the present example, of course. If the n-channel has a snapback voltage of 5 volts, then the current-limiting resistance (by Ohm's Law) should be 5 volts divided by 162 milliamperes, or about 30 ohms. In a layout embodiment of FIG. 25 the resistors were made of n+ material of silicided n-moat which was 100 microns long by 3–4 microns wide. Some embodiments are expected to have resistor values in the range of 10 to 100 ohms.

Returning to FIG. 6, it is noted that resistors R10, R11 and R14 are equivalent resistances of the physical structure shown, and transistors T10, T11, T12 and T13 are representations of transistors formed by the physical structure shown, and not additional to the physical structure shown. Resistors R12 and R13 are additional physical structures, for instance, to which the remarks of the preceding paragraph relate. These structures can be n+ resistors, for instance.

In FIG. 6, equivalent resistor R10 is in series with equivalent resistor R11, which in turn is connected to both resistor R12 and resistor R13. Thus, in FIG. 6, NMOS devices N10 and N11 each have a gate and one n+ region connected to VSS, with the other n+ source/drain region resistively connected to an n+ region of the n-tank 111. Resistors R12 and R13 are not directly connected to bond pad PAD. If the PAD at left is zapped positive with VSS grounded, a voltage rises across FETs N10 and N11. If FET N10 goes into BVDSS breakdown before N11 and parasitic NPN transistor T12 of FET N10 turns on, the current through resistor R13 causes a voltage drop across resistor R13. The voltage across FET N11 advantageously continues to rise until it also goes into BVDSS breakdown turning on parasitic transistor T13 of FET N11. The current through transistor T12 is advantageously limited by resistor R13 protecting it from damage. Transistor T13 is similarly protected by resistor R12.

By using multiple FET sections or devices protected by resistors in FIG. 6, additional current is generated to trigger the SCR 20. Current through equivalent resistor R10 creates a voltage drop across equivalent resistor R10. This forward biases the base of transistor T10 turning it on in SCR 20. The current through parasitic transistor T12 and parasitic transistor T13 is amplified by transistor T10 with most of the current going to substrate which is also the base of transistor T11. Since the substrate is low resistance, the resistance of equivalent resistor R14 is small. A large current is necessary to create a voltage drop across equivalent resistor R14 to forward bias the substrate and turn on transistor T11. Resistors R12 and R13 with transistors T12 and T13 advantageously provide the current in T10 to create the voltage drop in resistor R14 and turn on transistor T11. When transistor T11 turns on, it drives the base of transistor T10 and the SCR20 latches up. Most of the ESD current flows through transistor T10 and transistor T11 which have large junction areas and provide good ESD protection. At 2 kilovolts, the Human Body Model ESD current is on the order of 1.3 amperes in one example.

FIG. 7 illustrates another way to trigger an SCR with multiple NMOS devices such as N20 and N21. In this case resistors R21 and R22 are directly connected between the PAD and NMOS devices N20 and N21. If the pad is zapped positive with VSS grounded, resistor R22 and resistor R21 conduct current, raising the voltage across FETs N20 and N21. If FET N20 goes into BVDSS breakdown before N21 and parasitic transistor T22 turns on, the current through resistor R21 causes a voltage drop across resistor R21. The voltage across transistor N21 will continue to rise until it also goes into BVDSS breakdown turning on parasitic transistor T23. The current through transistor T22 is limited by resistor R21 protecting it from damage and transistor T23 is protected by resistor R22. When FETs N20 and N21 go into BVDSS breakdown, current is injected into the substrate. When enough current flows into the substrate to forward bias the substrate, transistor T21 turns on. Transistor T21 drives the base of transistor T20. The current is amplified by transistor T20 with most of the current going to substrate, forward biasing the substrate and driving the base of transistor T21. As a result, the SCR30 latches up. By using multiple-section FET devices protected by resistors, additional current can thus be generated to trigger SCR 30.

The substrate is modeled by an equivalent resistor network as shown by resistance elements R23, R24, R25, R26, and R27 of FIG. 7. (Resistor R20 and transistors T20 and T21 are also circuit modeling elements.) Parasitic transistor T22 contributes more current than parasitic transistor T23 in forward biasing the base of transistor T21, since transistor T23 is farther away and a smaller fraction of the current flows to the base of transistor T21 from transistor T23. A larger fraction of the current of transistor T23 is collected by VSS. For the best results, FETs N20 and N21 are located in proximity to tank 121 so that the electrical interaction occurs with transistor T21 by transistors T22 and T23 in an ESD event.

Figure 21:
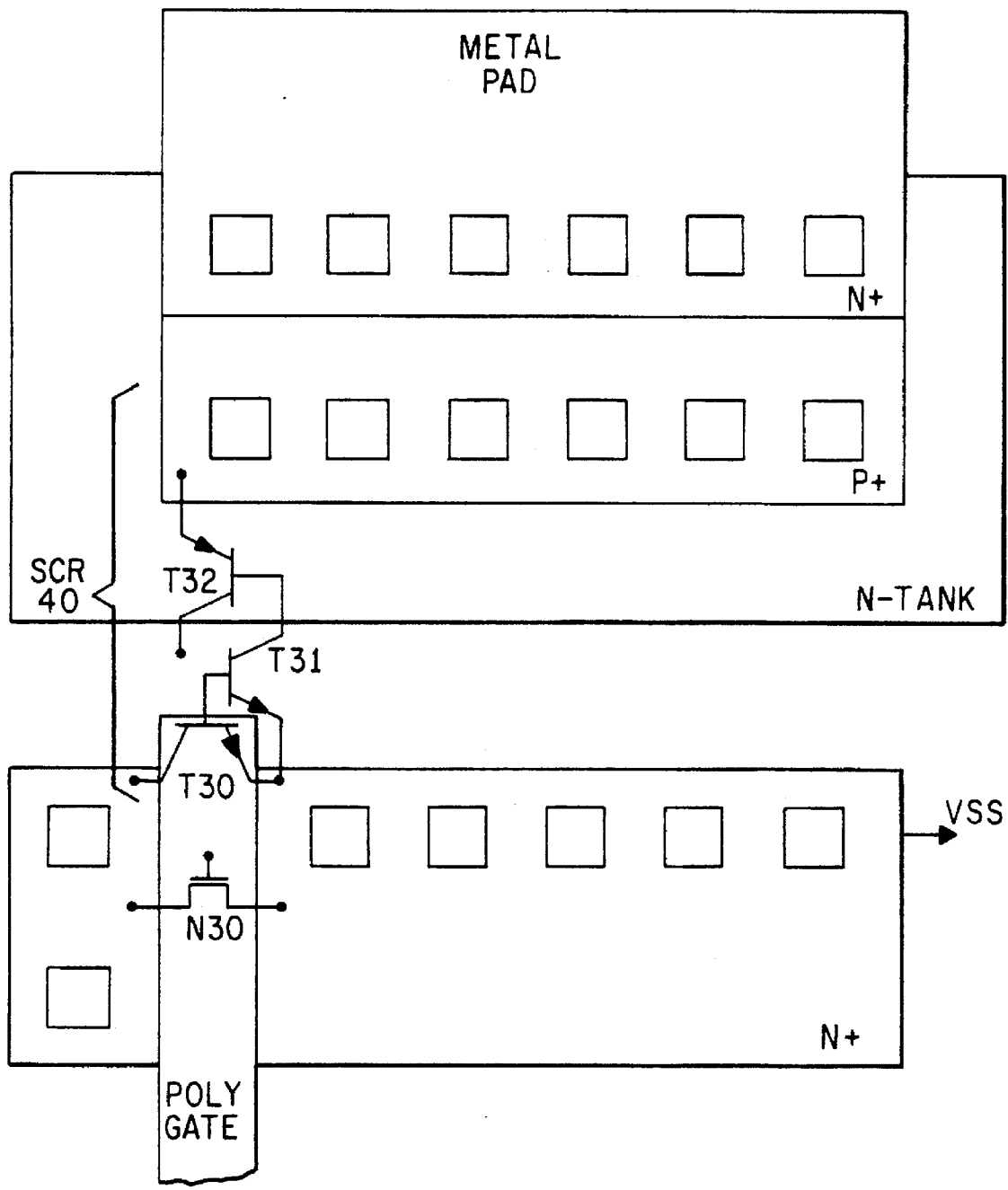
FIG. 21 is a microscopic plan view of part of an ESD protection circuit.

Before discussing the next figures in order, FIG. 21 shows a top-side view, or layout of an NMOS device N30, with the base of its parasitic NPN transistor T30 touching the base of the NPN transistor T31 of SCR 40. This layout is similar in operation to FIG. 7. As a result, transistor T30 operates upon an occurrence of an electrostatic discharge event to trigger the SCR more efficiently. Transistor N30 in one embodiment is an output buffer device, and in an alternative embodiment is a dedicated NMOS transistor provided for triggering the SCR to protect the integrated circuit against an electrostatic discharge event.

In one embodiment, the multiple MOS devices protected by resistors are an output buffer FET device divided into sections and used to trigger an SCR. The circuit is the same as FIG. 7 except the gate of FETs N20 and N21 are connected to a signal line instead of VSS. The MOS output buffer improved in this way advantageously doubles both as an output buffer and as a trigger for the SCR. This saves area by eliminating extra dedicated NMOS devices which might otherwise be used to trigger the SCR.

Further detailed description of the hereinabove-described improvements and additional embodiments is provided next.

In FIGS. 9a and 9b, a respective transistor or diode is connected from DVDD to LVDD for devices with multiple power supplies. With a diode connected DVDD to LVDD, the output buffer of FIG. 2 improved on an ESD test from 1.5 KV to 3.5 KV.

In FIGS. 10 and 11 respectively a diode or a transistor is connected from VSS to VDD to be forward biased when VSS goes more positive than VDD. This protects the logic between VDD and VSS when VSS is zapped positive and VDD grounded.

In FIGS. 12–16, multiple MOS devices (each protected by a resistor) are used to trigger a SCR. SCRs are difficult to trigger on devices with low impedance substrate. These circuits advantageously provide an improved structure and method to trigger SCR's for ESD protection. This is especially useful for CMOS devices with low resistance substrates.

FIG. 12 depicts the structure of FIG. 6 in electrical schematic form with a total of four FET sections and resistors to each section shown.

FIG. 13 shows an embodiment wherein a transistor T15 has its emitter connected to an ESD protected pad. A FET is sectioned into four devices with respective resistors connected to the base of transistor T15. The collector of transistor T15 delivers ESD current to the substrate SUB.

Figure 14:
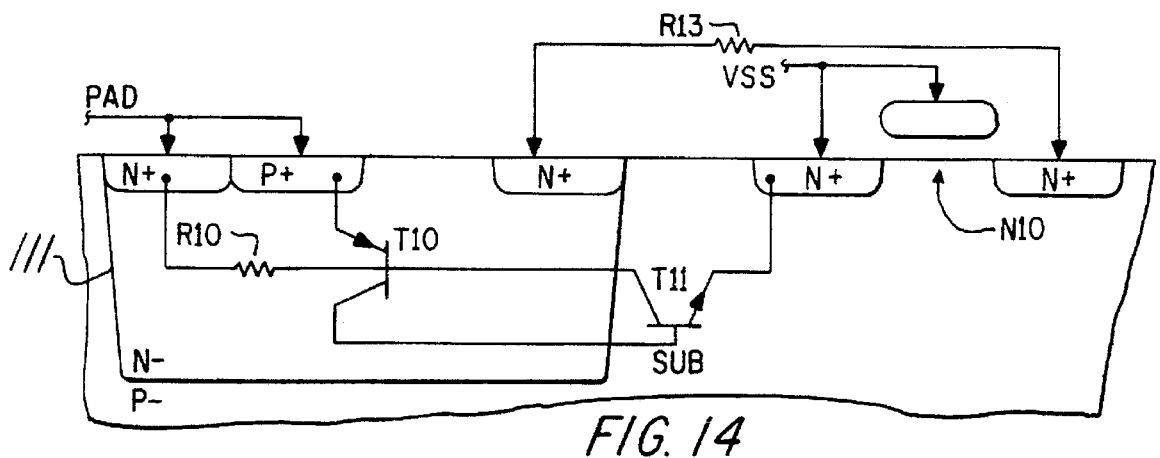
FIG. 14 is a cross section of another ESD protection circuit.

FIG. 14 shows part of the structure of FIG. 6 wherein tank 111 is connected by resistor R13 to FET N10. An SCR formed by equivalent transistors T10 and T11 with equivalent resistance R10 is connected between PAD and VSS.

FIG. 15 depicts the structure of FIG. 7 in simplified schematic form but with a total of four FET sections and resistors to each section. The resistors are connected to the protected PAD. SCR30 with transistors T20 and T21 is illustrated with equivalent resistors R omitted. FIG. 16 is a simplified cross-section of FIG. 7, and FIG. 16 relates to FIG. 15.

In FIGS. 17 and 18 cascaded bipolar devices T1 and T2 are driven by a MOS device N for ESD protection. When the pad is zapped positive, the voltage increases across the n–channel device. It breaks down in the 10 volt range, for instance. Since the n-channel device does not handle enough current to provide good ESD protection by itself, it is connected to cascaded bipolar devices for better ESD protection by current amplification.

FIG. 18 shows two n-wells 131 and 133. Well 131 connects to the PAD at n+ and p+ regions 141 and 143. Metal M connects an n+ region 145 in well 131 to n+ and p+ regions 147 and 149 in well 133. An n+ region 151 crosses the boundary of well 133 to join FET N. A VSS substrate connection is made to the gate and n+ region 153 of FET N as well as a p+ region 155 of connection to the substrate. In this way, wells are cascaded for each of a plurality of ESD protection transistors.

A technical advantage is that the circuitry provides a way to shunt the ESD current to the substrate power supply (e.g., the substrate as element for conducting supply from VSS), and protect input or output MOS devices.

Another technical advantage is that at least some of the embodiments provide a structure of and method of using a MOS device to trigger its parasitic lateral bipolar NPN or PNP transistor and amplify this current through cascaded bipolar transistors. The voltage is clamped to protect input, outputs or internal logic, with the majority of the current going through the cascaded bipolar devices.

FIG. 19 further illustrates ESD protection for outputs/inputs on chips with multiple VDD's. In FIG. 19, if DVSS is at ground and the output pad is zapped positive by zap Z6, DVDD starts at ground and powers up positive. Voltage is applied across DVDD and DVSS and a certain amount of current I(1) flows through the internal logic. A transistor such as T2 or a diode is placed between dirty VDD (DVDD) and logic VDD (LVDD) so that momentary internal circuit current I(2) is amplified. Both transistors have a gain of about four, so that when cascaded they together provide a gain of 16 going over to the logic VDD. In this way, much less current is needed for effective ESD performance. A diode substituted for transistor T2 increased ESD from 1.5 to 3.5 Kv in one example. Replacing the diode with transistor T2 in this example can increase ESD to the 8 Kv (kilovolt) range. This improvement is applicable to processors and other integrated circuits generally. The circuit of FIG. 19 also models IC capacitance with capacitances C1 and C2. C1 and C2 give additional ESD performance as current is needed to charge these capacitors.

A diode D2 (FIG. 1) is placed between VSS and VDD so that if VSS goes more positive than VDD, the diode is forward biased, providing ESD protection. If there is only one VSS on the chip and it is tied to substrate, then normally there is a parasitic diode VSS-to-VDD. Devices that have dirty VSS which is not tied to substrate are also improved to avoid damage to internal logic in case of occurrence of ESD.

For large chips with multiple power suppies, it is possible to advantageously shunt the ESD current through the power supply pads without reaching in FIG. 19 the BVDSS breakdown voltage of the n-channel output device.

Before an ESD test, LVDD and DVDD initially are at 0 volts due to substrate leakage currents. When the output pad is zapped positive by Z6 with DVSS grounded, the parasitic transistor T1 of FET P1 turns on, powering up DVDD and protecting p-channel FET P1. In one example of output buffers, this transistor (T1) has a gain of approximately 4, and 75% of the current will go to substrate and the other 25% will go to DVDD. If the BVDSS breakdown of the n-channel output device N1 is 10 V, the voltage on DVDD would reach 10 V minus a diode drop before BVDSS breakdown. Current I(1) is the DVDD to DVSS current during initial power up of the circuit (nodes switching, floating inputs creating DC current, possible bus conflicts due to being uninitialized) and current I(2) is the current LVDD to LVSS during initial power up. Current I(1) is amplified by 4 due to transistor T1, and current I(2) is amplified by 16 due to transistor T1 cascaded with transistor T2.

For human body ESD tests, a 100 pf capacitor is discharged through a 1500 ohm resistor. The peak current during a 2 KV ESD test is 1.3 A. If current I(1) is at least 325 mA then transistor T1 amplifies by 4 and passes the ESD peak current. Moreover, if the current I(2) is greater than 81 mA at power up, transistors T1 and T2 amplify by 16 and successfully pass the peak current. In this way, the output buffer passes 2 KV without the n-channel output device N1 reaching BVDSS breakdown voltage. Another transistor could be cascaded with transistor T2 to give even greater gain to current I(2).

Approximate values for 2 KV ESD protection are given next, with each value independent of others.

I(1) 325 mA at 8 V (DVDD to DVSS)

I(2) 81 mA at 6 V (LVDD to LVSS)

C1 6,300 pf at 8 V (DVDD to DVSS)

C2 2,100 pf at 6 V (LVDD to LVSS)

In FIG. 20, the p-channel FET P1 is improved by adding n+ regions at the boundary of its tank and connecting them to DVDD thereby forming transistor T1. These are cascaded to further transistor T2 by connecting DVDD to a p+ region in the T2 well and then connecting LVDD to n+ regions in the T2 well. Transistor T2 is guard-ringed with a low impedance substrate connection G in FIG. 20, to collect the substrate current if DVDD goes more positive than LVDD.

Some of the important features in various embodiments are: Transistor or diode or cascaded transistors connected from VDD1 to VDD2 for input or output buffer ESD protection, or to protect circuits connected between VDD1 and VSS1. Transistors can be advantageously cascaded from input or output pad to VDD. A diode or transistor, which conducts when VSS goes more positive than VDD, is provided to protect circuits connected between VDD and VSS from ESD. This is especially useful for circuits with multiple VSS's or floating substrate. Multiple MOS devices (each protected by a resistor) are used to trigger an SCR. An output buffer is divided into sections and protected by resistors to trigger SCR for output buffer ESD protection. An SCR with MOS trigger and resistors advantageously is provided to connect the sources of MOS device sections to the base of a bipolar device in an SCR (FIG. 6), for input or output buffer ESD protection, or to protect circuits connected between VDD1 and VSS1. Cascaded bipolar devices are driven by a MOS device (FIG. 5) for ESD protection of inputs, outputs or circuits between VDD and VSS.

Layouts for various embodiments are next described.

Figure 22:
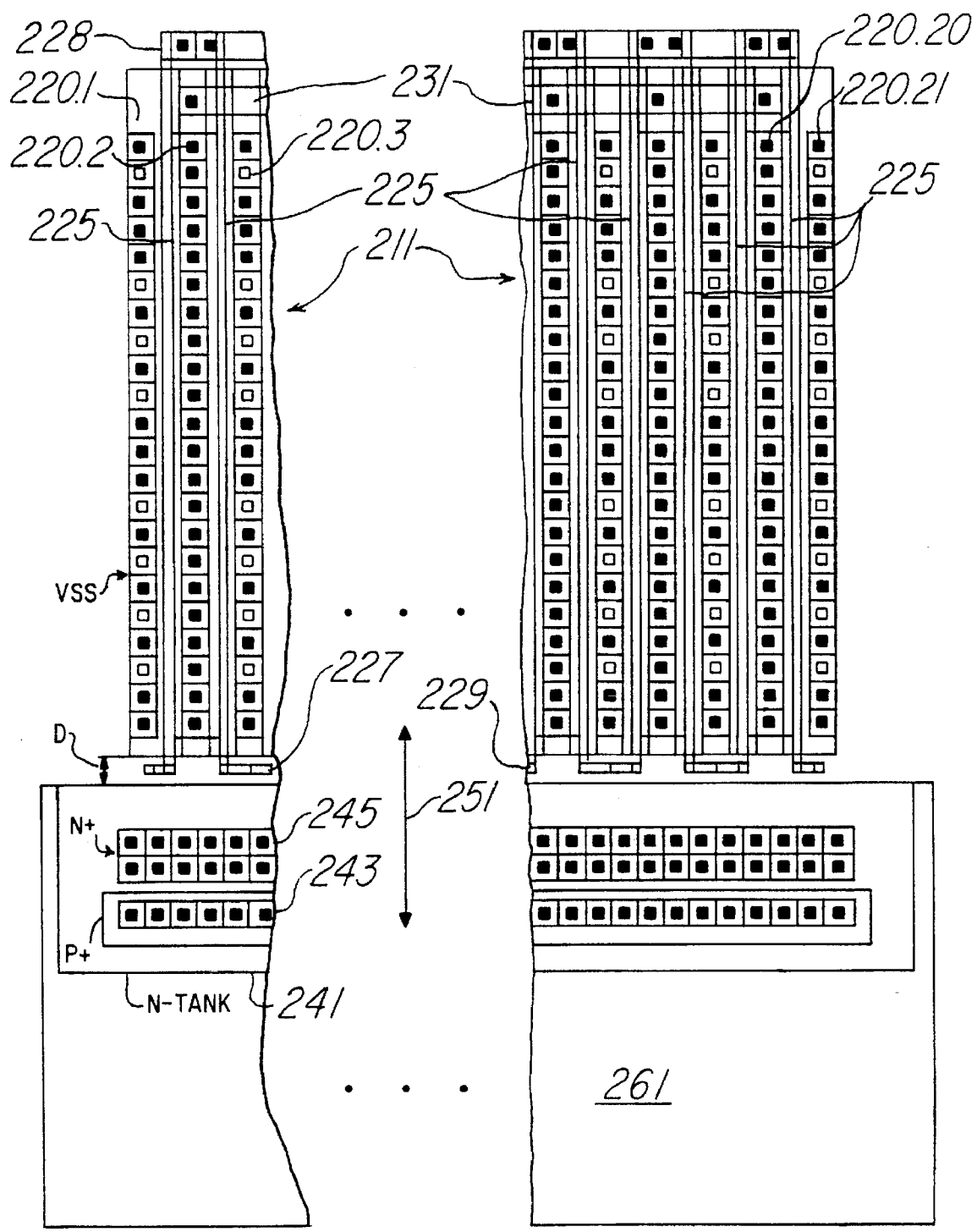
FIGS. 22–28 are microscopic plan views of parts of layouts of ESD protection circuits.

In FIG. 22 an n-channel FET 211 has twenty one (21) columns 220.1, .2, .3, ..., .21 of n-type material with twenty interior channels on which a serpentine polysilicon gate 225 is provided. Gate 225 has 20 columns connected by bars such as 227, 228 and 229. A parallel connection bar 231 of first-level metal connects every other column 220.2, 220.4, ... 220.20. Ellipsis dots indicate repetition in the structure that is omitted from the drawing for conciseness of illustration. A small separation distance D of about 2.7 microns separates the columns of the FET from an n-tank 241. In the n-tank 241 is p+ region 245 and then closer to the FET 211 is an n+ region 243 in the n-tank 241. First-level metal 261 connects the regions in the tank 241 to a bond pad that is to be ESD protected. The FET 211 is advantageously a buffer FET having odd-numbered columns 220.1, .3, ... connected to VSS and even-numbered columns 220.2, .4, ... connected to an output pad.

The n-tank 241 extends laterally across FIG. 22 next to the base of each column of the FET 211. Bilateral symmetry with respect to an axis 251 is exhibited by the whole of the structure formed by FET 211, n-tank 241, p+ region 245 and n+ region 243. The proximity of the FET 211 to the n-tank 241, as well as the bilateral symmetry and sectioning of FET 211 all advantageously contribute to effective ESD protection for the pad connected to metal 261. Remarkably, it is unnecessary to provide any resistors at all between the FET 211 and the metal 261 of the type of resistors R12, R13, R21 and R22 of FIGS. 6 and 7. The n-tank 241 and regions 243 and 245 together with FET 211 provides SCR action for ESD protection. As in FIG. 21 interaction across distance D connects the bases of an equivalent transistor of the SCR and a parasitic transistor in each gate column of the FET 211. Moreover, the proximity of distance D also provides a low resistance connection from the substrate touching the n-tank 241 to the substrate touching the VSS odd numbered columns of the FET in sections so that the bipolar transistors of the SCR are coupled to the parasitic bipolar transistor of the FET as discussed in connection with FIG. 21. Distance D is any distance that accomplishes the function, and this distance in some embodiments is less than 5 microns.

Figure 23:
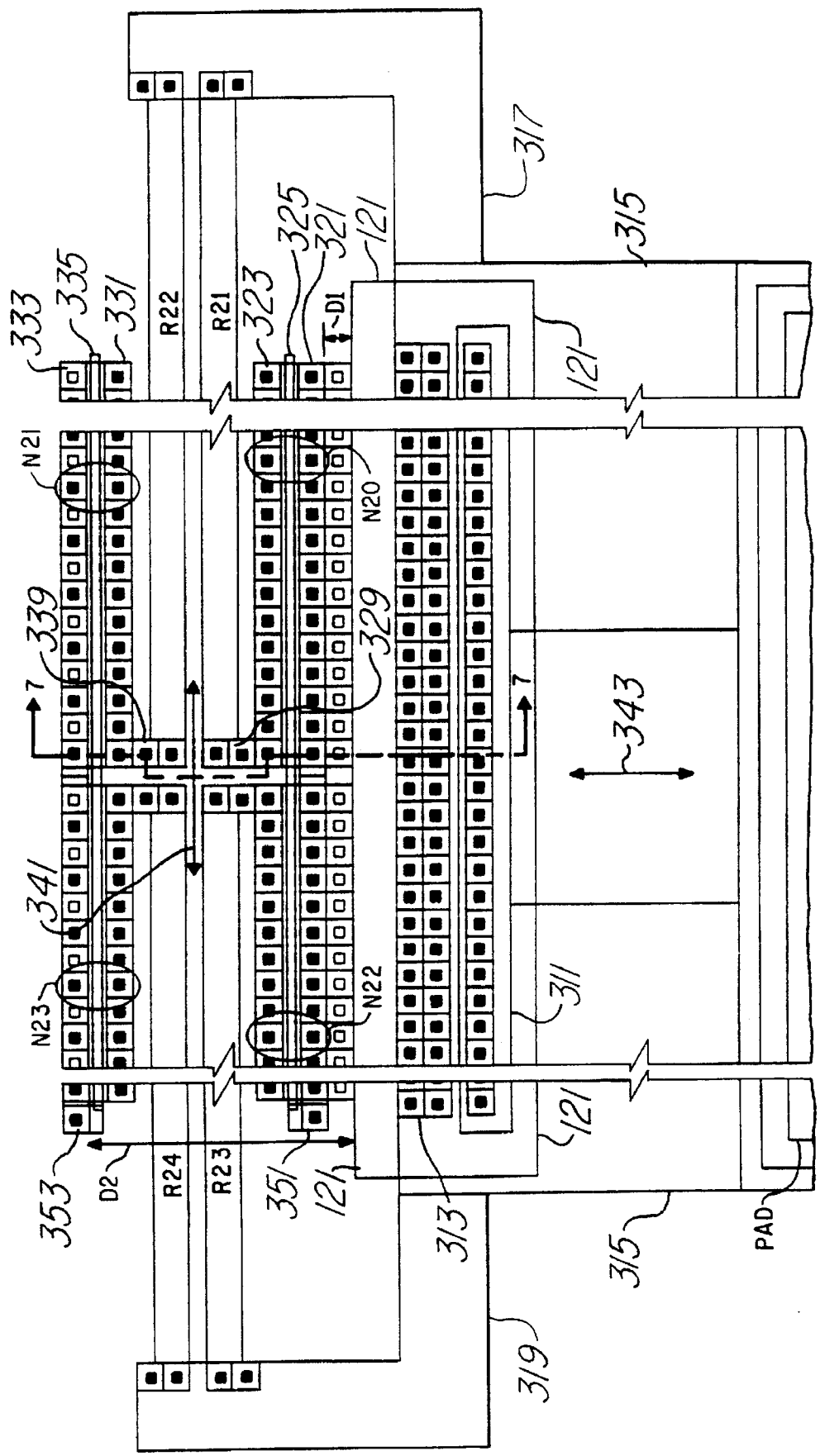

In FIG. 23, a layout of the circuit of FIG. 7 has a section line 7—7 indicating the cross-section illustrated in FIG. 7. A PAD is connected to metal 315. An n-tank 121 has n+ region 311 and p+ region 313 connected to metal 315 by numerous contacts indicated as tiny squares. Arms of metal 317 and 319 extend in "L" shapes and contact to four n+ resistors R21, R22, R23 and R24. The resistors form parallel pairs of collinear stripes R21, R23 and R22, R24 of n+ diffusion, or n-moat. Four field effect transistors N20, N21, N22 and N23 form an "H" which interiorly connects to the four resistors R21, R22, R23 and R24. FET N20 has parallel n+ regions 321 and 323 and a gate 325 disposed between and above them. FET N21 has parallel n+ regions 331 and 333 and a gate 335 disposed between and above them. Metal overlies and contacts each of the parallel n+ regions 321, 323, 331 and 333, and then connects by K-bar branches 329 and 339 respectively to resistors R21 and R22.

The structure of FETs N22 and N23 and their metal connections to resistors R23 and R24 are bilaterally symmetrical along an axis 343 with those of FETs N20 and N21 and resistors R21 and R22. Also, the structure of FETs N20 and N22 and the metal connections to resistors R21 and R22 are bilaterally symmetric about an axis 341 with those of FETs N21 and N23 and resistors R22 and R24. The entire ESD protection circuit structure of FIG. 23 including metal 315, n-tank 121 and the FETs and resistors is also bilaterally symmetrical relative to perpendicular axis 343. The bilateral symmetry assists in equally distributing voltage to the FETs. In a further advantageous feature, tank 121 forms an elongated rectangle adjacent and generally parallel to the length of n+ region 321 of FET N20 and the corresponding n+ region of FET N22. In this way a zone of SCR coupling between the tank 121 and the FETs N20 and N22 has an advantageously long length about equal to the length of the FETs and an advantageously small width equal to separation distance D1. The FETs N21 and N23 are also SCR coupled to the n-tank 121 over a longer separation distance D2.

Metal connections 351 and 353 connect each gate and one n+ region of each FET together and by vias (tiny open squares on FIG. 23) to a VSS or ground reference pad distinct from the PAD at bottom of FIG. 23. Also, n+ regions 321 and 333 of FETs N20 and N21 are connected by metal to their corresponding region of FETs N22 and N23 as uprights of an "H" shape.

Well and tank are synonymous as used herein. Wells can be made by implanting or by diffusion processes in different methods of manufacture. Thin epi is the region of the epitaxial substrate beneath the tank. Resistors can be fabricated as diffusion resistors, tank resistors, and polysilicon resistors. Thus, in the embodiment of FIG. 23 a set of diffusion resistors R21–R24 are tied to a bond pad at one end and then at another end to respective n-channel FET devices N20–N23 to trigger an SCR formed by tank regions and n+ region 321 of each FET N20 and N22. The schematic diagram of FIG. 15 shows this circuit configuration also.

Figure 24:
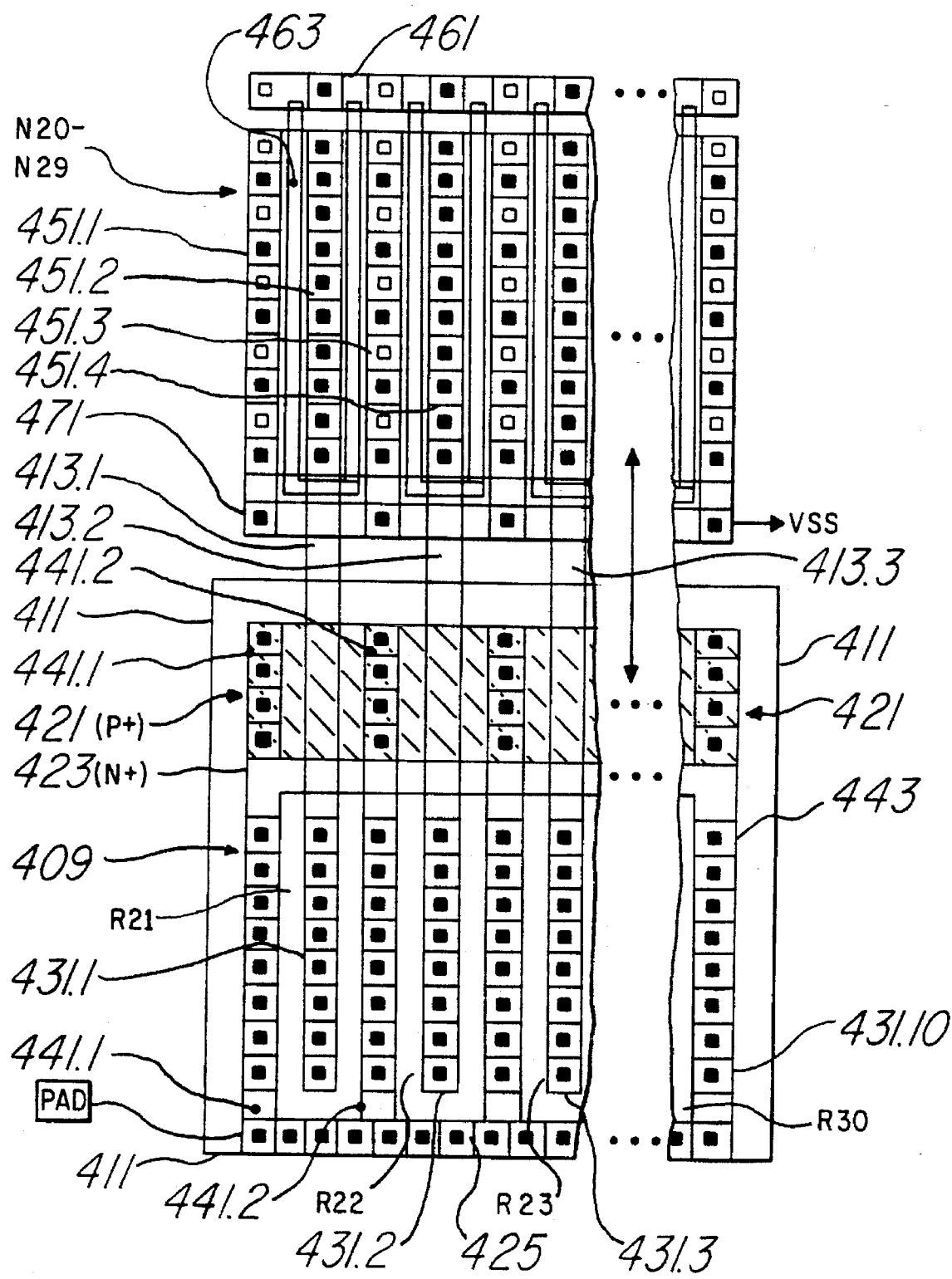

FIG. 24 shows another embodiment of FIG. 15 wherein tank resistors R21–R30 are tied to an SCR at one end and at another end to any suitable number of respective n-channel FET devices N20–N29. The schematic diagram of FIG. 15 shows a corresponding electrical circuit. In FIG. 24 ten FETs N20–N29 are connected to tank resistors 409 in n-tank 411 by ten first-level metal conductors 413.1, 413.2, 413.3, . . . Ellipsis dots on the diagram indicate repetition of a further seven of the ten structures and FETs.

In the n-tank 411 is a p+ region 421 adjacent to interdigitated regions of n+ diffusion 423, 409, and 425. Compare FIG. 7 which is not a cross-section of FIG. 24 but indicates similar regions in the n-tank of FIG. 7. Tiny darkened squares indicate contacts by metal to the n+ and p+ regions in the tank 411. A pad protected by this circuit from ESD is connected by metal to n+ region 425. Stripes 441.1, 441.2, . . . connect n+ region 425 to a fork-shaped region of n+ material 443. The stripes further extend to contacts with p+ region 421 as indicated by repeated notations 441.1 and 441.2 thereat.

Strips of n+ diffusion 431.1, 431.2, 431.3, . . . are connected by metal 413.1, 413.2, 413.3, . . . to respective even-numbered columns 451.2, 451.4, . . . of n+ diffusion in the FETs N20–N29. A polysilicon strip 461 joins U-shaped polysilicon gates 463 of the FETs. A strip of n+ material 471 joins odd-numbered columns 451.1, 451.3, . . . of n+ diffusion in the FETs N20–N29 into a fork-shaped region of n+, and these columns are connected by vias (open squares) to VSS.

Returning to the area of the n-tank 411, the metal 441.1, 441.2, . . . is a fork-shaped element connecting to the protected bond pad. The metal 413.1, 413.2, 413.3 . . . provides respective connections to the FETs and is interdigitated with the fork-shaped element 441.1, 441.2, . . . . The just-described metal parts connect to n+ regions that define rectangular spaces in the n-tank 411 that are marked with tank resistor designations R21–R30. These resistors correspond in concept with resistors R21 and R22 of FIG. 7.

Figure 25:
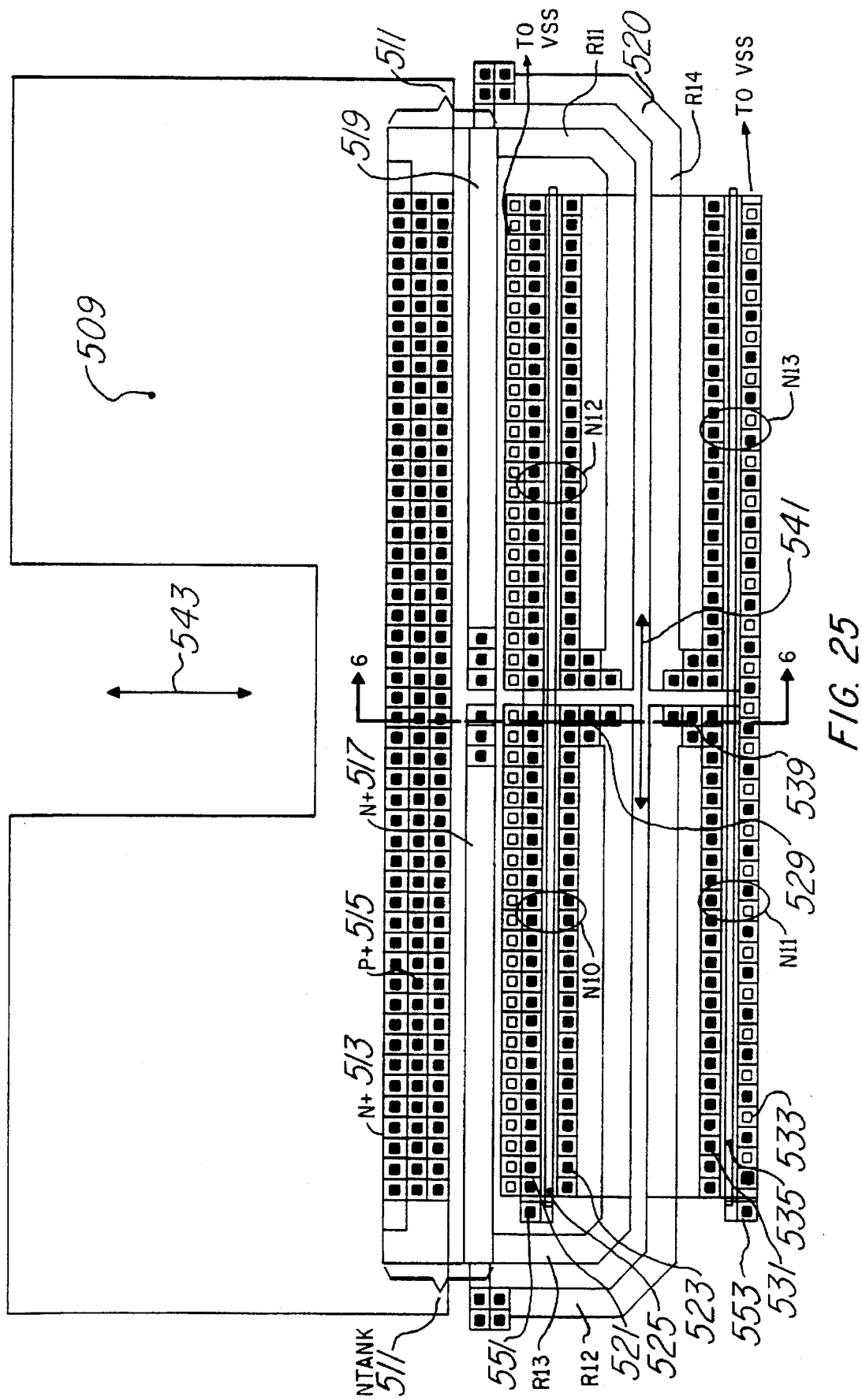

In FIG. 25, a layout of the circuit of FIG. 6 has a section line 6—6 indicating the cross-section illustrated in FIG. 6. A PAD is connected to metal 509. An n-tank 511 has n+ region 513 and p+ region 515 connected to metal 509 by numerous contacts indicated as tiny squares. Collinear n+ regions 517 and 519 connect at their extremities to four n+ resistors R11, R13, R12 and R14. The resistors form parallel pairs of stripes R11, R12 and R13, R14 of n+ diffusion, or n-moat. Each of the stripes is comprised of perpendicular segments joined by a 45 degree bend section such as 520.

Four field effect transistors N10, N11, N12 and N13 form an "H" and interiorly connect to the four resistors R13, R12, R11 and R14 respectively. FET N10 has parallel n+ regions 521 and 523 and a gate 525 disposed between and above them. FET N11 has parallel n+ regions 531 and 533 and a gate 535 disposed between and above them. Separate metal strips respectively overlie and contact each of the parallel n+ regions 521, 523, 531 and 533, for low impedance. H-bar branches 529 and 539 respectively connect regions 523 and 531 to resistors R13 and R12. Region 523 and resistor R13 form a hairpin curve, and with region 517 form a "G" shaped structure in n+. A bilaterally symmetric mirror-image of the "G" is also present.

The structure of FETs N10 and N11 and their connections to resistors R13 and R12 are bilaterally symmetrical along an axis 543 with those of FETs N12 and N13 and resistors R11 and R14. N10, N12, R13 and R11 are bilaterally symmetrical along an axis 541 with N11, N13, R12 and R14. The entire ESD protection circuit structure of FIG. 25 including metal 509, n-tank 511 and the FETs and resistors is also bilaterally symmetrical relative to perpendicular axis 543. The bilateral symmetry assists in equally distributing voltage to the FETs. SCR coupling between the tank 511 and the FETs N10–N13 is thus established by the resistors R11–R14.

Metal connections 551 and 553 connect each gate and one n+ region 521 and 533 respectively of each FET together and by vias (tiny open squares on FIG. 25) to a VSS or ground reference pad distinct from the PAD connected to metal 509 at top of FIG. 25. Also, n+ regions 521 and 533 of FETs N10 and N11 are connected by metal to their corresponding region of FETs N12 and N13 as uprights of an "H" shape.

Figure 26:
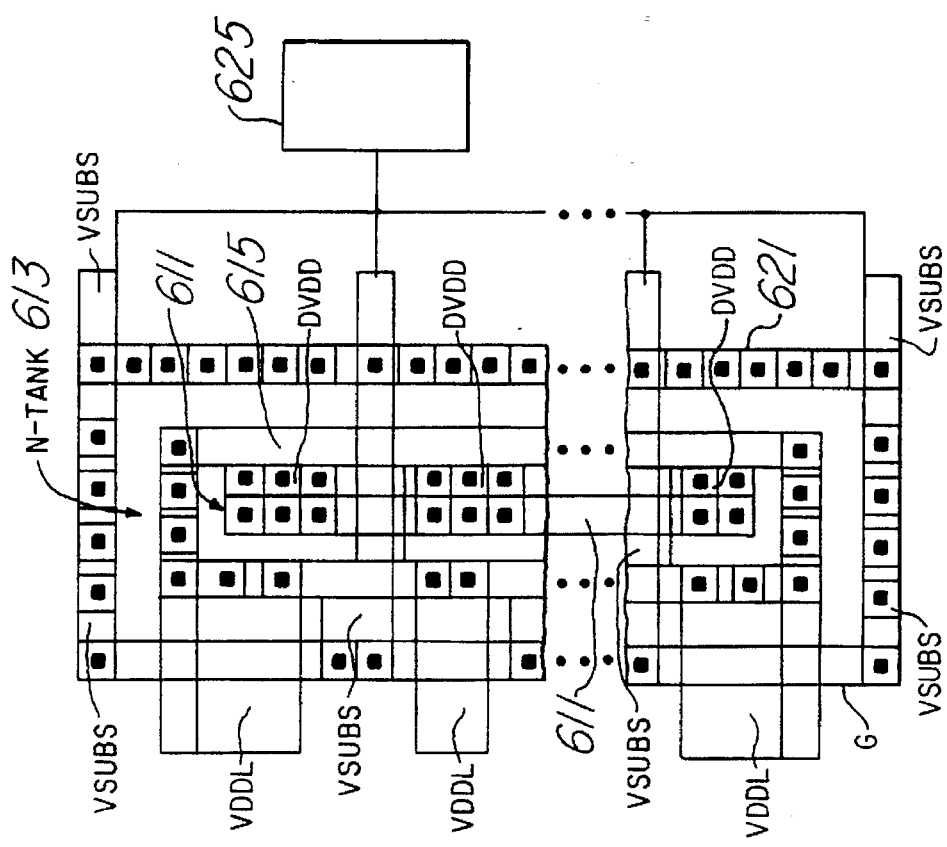

In FIG. 26 a layout of transistor T2 of FIGS. 1, 2, and 20 has "dirty" supply pad DVDD (VDD1 of FIGS. 1 and 2) connected to an interior p+ strip region 611 of an elongated rectangular n-tank 613. An n+ region 615 is diffused inside the boundary of n-tank 613. Region 615 is connected by first level metal to "clean" or logic supply pad VDDL (VDD2 of FIGS. 1 and 2 or LVDD of FIG. 20). A guard ring 621 of p tank moat (ring G in FIG. 20) is diffused in a band surrounding and separated from the n-tank 613. The guard ring 621 is connected by first level metal VSUBS to a substrate power supply 625 tied to pad VSS. The substrate power supply can also be a substrate bias generator circuit. The guard ring 621 provides protection by collecting current when VDD1 goes more positive than VDD2. Eight metal DVDD and eight VDDL contact areas (of which 5 of each are indicated by ellipsis dots) provide low impedance connection to DVDD and VDDL respectively. Nine metal contacts on all sides of the guard ring 621 provide low impedance connection VSUBS. In this way sudden high current does not burn up the structure.

Figure 27:
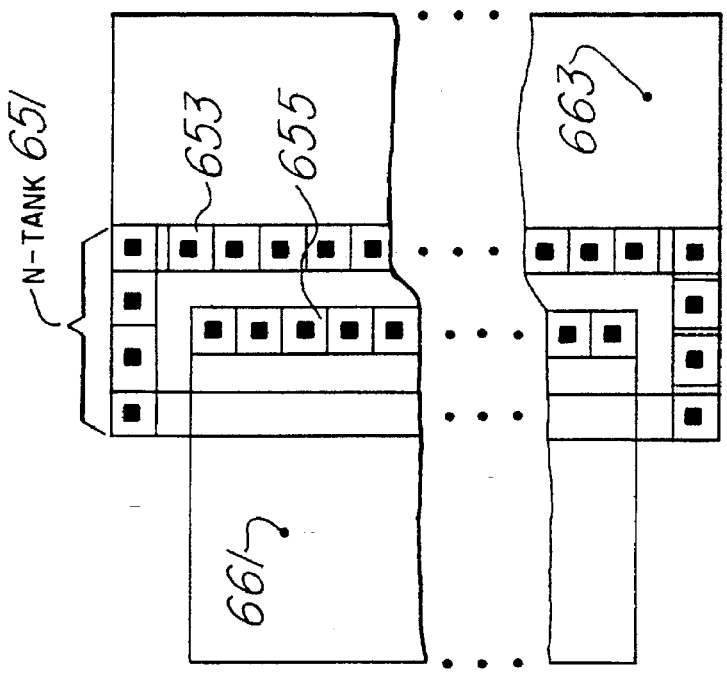

The layout of FIG. 27 illustrates transistor T3 of FIG. 1 and transistor T4 of FIG. 3. In FIG. 27, an elongated n-tank 651, having about 75% of its length indicated by ellipsis, has an n+ rectangular band 653 just within the boundary of the n-tank. An interior strip 655 of p+ material is connected by contacts to a wide metal conductor 661. Another metal conductor 663 connects to the n+ band 653 for low impedance also.

Figure 28:
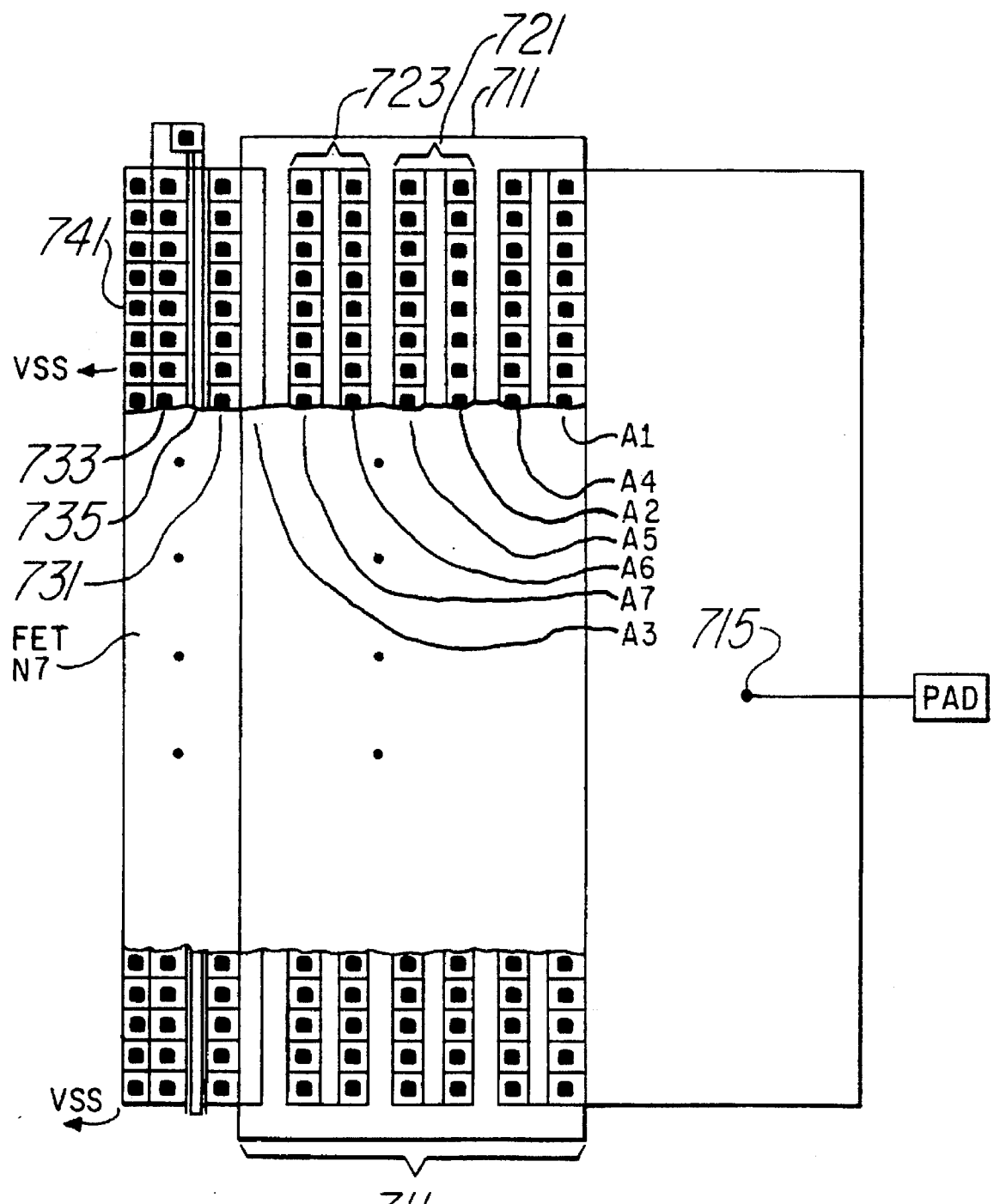

FIG. 28 illustrates a layout of a cascaded transistor structure analogous to that of FIG. 5 except that three transistors are cascaded in an n-well 711 instead of two as in FIG. 5. Regions of n+ diffusion A1, A2, A6 and A3 and p+ regions A4, A5 and A7 are all provided in the n-well 711. A PAD is connected to metal 715 which contacts both regions A1 and A4. Separate metal stripe 721 (like M1 of FIG. 5) contacts and connects regions A2 and A5. Another separate metal stripe 723 connects regions A6 and A7. In this way transistors established in the n-well 711 are cascaded. FET N7 has n+ region 731 joined to region A3. Another n+ region 733 connects by a metal strip 741 to VSS. A gate 735 lies between and above regions 731 and 733.

Figure 29:
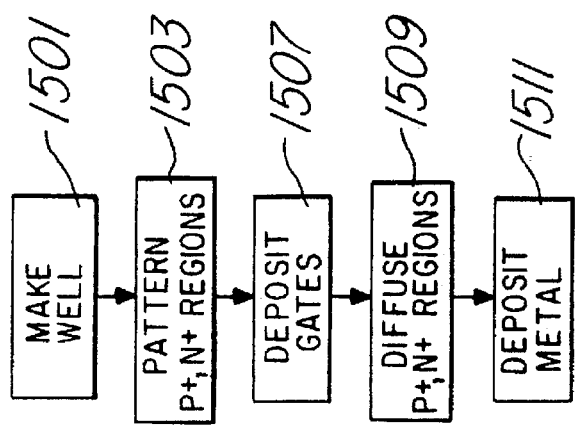
FIG. 29 is a flow diagram of a process of making a cascaded transistor ESD circuit.

In FIG. 29 a process of making an electrostatic discharge protection circuit as in FIGS. 5 and 28 has a step 1501 of making the n-well 711 by diffusion so that the well has opposite conductivity type from that of the substrate. Next, a step 1503 patterns regions A1, A2, A6 and A3 and regions A4, A5 and A7. In this way the process establishes distinct semiconductive regions A1–A7 in the well TK or 711 and in the substrate outside the well to form bipolar transistors (e.g. T7 and T8 of FIG. 5) in the well with at least one of the bipolar transistors connected to a field effect transistor N7 that includes at least one of the semiconductive regions in the substrate outside the well. A step 1507 deposits polysilicon gate material 735 for each FET such as N7. Then a step 1509 diffuses n+ and p+ regions 731 and 733 on either side of the gate 735 as well as A1–A7. A step 1511 deposits distinct regions of metal 715, 721, 723 and 741 all at the same time to contact to and cascade the transistors in well 711 as well as contact for VSS at region 741. Step 1511 thus deposits a connection between at least two of the distinct semiconductive regions such as A2 and A5 (and A6,A7 in FIG. 28) in the well to cascade the bipolar transistors in the well. The step 1511 also includes a step of depositing bond pads and connecting one of the bond pads (e.g. a buffer input or output) to the semiconductive regions A1 and A4 in the well TK and connecting a second of the bond pads VSS to the field effect transistor N7.

Figure 30:
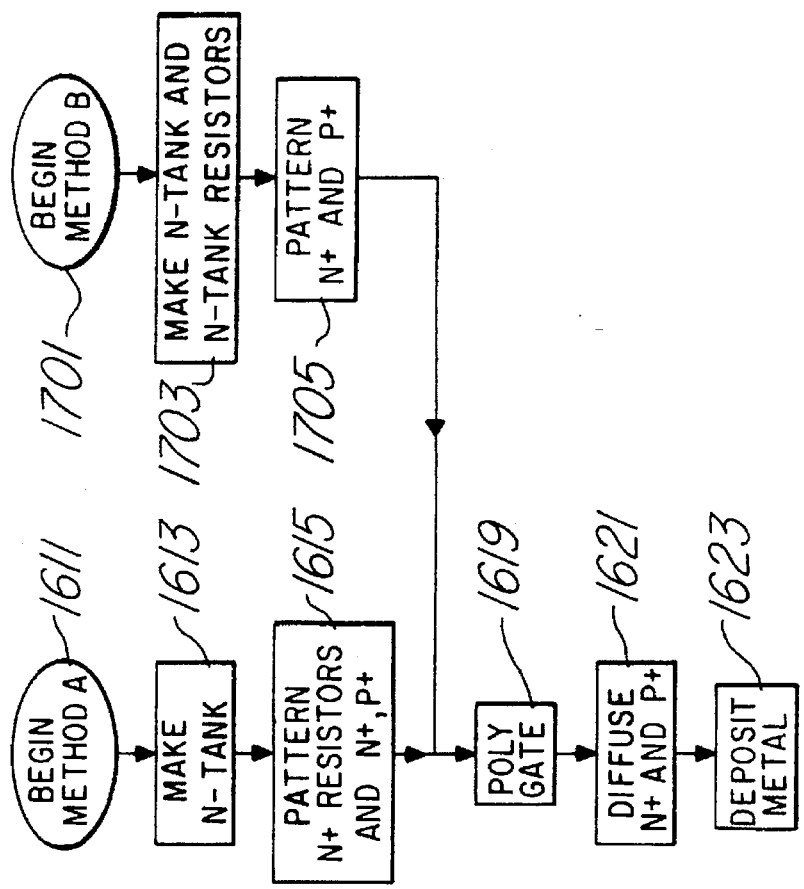
FIG. 30 is a flow diagram of processes of making a sectioned FET, multiple resistor ESD circuit.

FIG. 30 shows steps for two alternative processes of making a circuit for triggering an electrostatic discharge protection circuit. Both have steps of fabricating a field effect transistor circuit in sections resistively connected to an SCR or to a bond pad. The sections are located in proximity to the electrostatic discharge protection circuit to trigger it through the substrate upon an electrostatic discharge event.

Operations in FIG. 30 begin in a first method A at point 1611 and proceed to a step 1613 to make an n-tank as in FIGS. 6 and 7 for instance. Next a step 1615 patterns n+ and p+ regions for transistors and also patterns n+ resistors as in FIG. 23 or 25. Step 1619 provides a polysilicon gate for each FET. A subsequent step 1621 diffuses the n+ and p+ regions. In this way, the field effect transistor is fabricated in sections resistively connected to a bond pad, or SCR as the case may be. Bond pads including the bond pad to which the resistive connections are made for ESD purposes are provided by deposition of one or more levels of metal in a step 1623.

In FIG. 30 operations of an alternative method B commence at point 1701 and proceed to a step 1703 of making an n-tank and n-tank resistors as in FIG. 24. Patterning of n+ and p+ regions occurs subsequently in a step 1705 followed by steps 1619–1623. Definition of the resistors by pattern of n+ and deposition of metal thus occurs in steps 1705 and 1623 as well.

Figure 31:
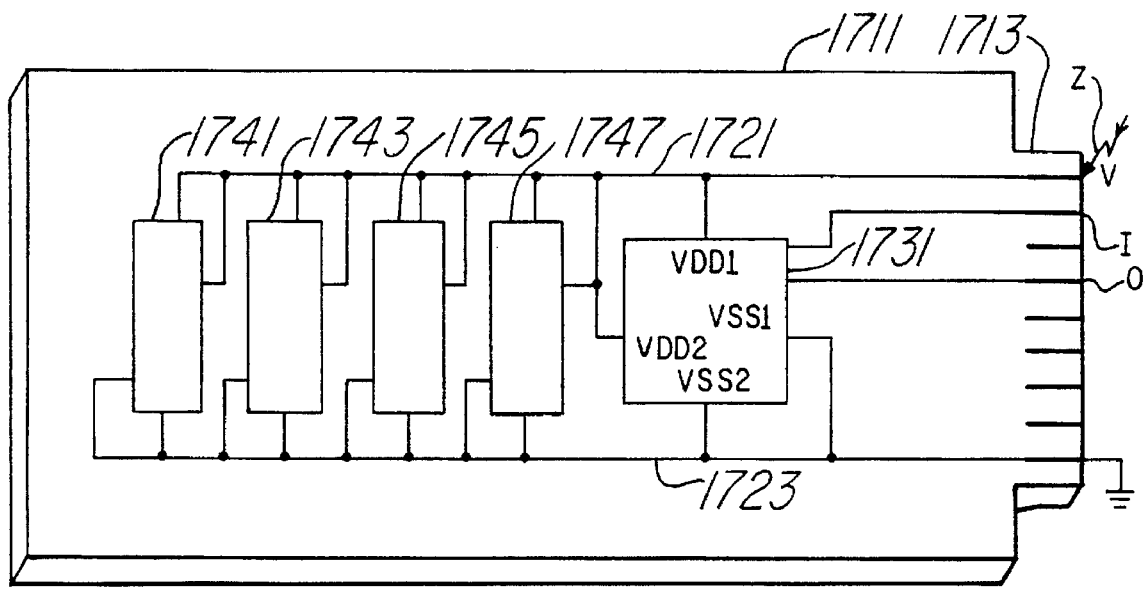
FIG. 31 is a partially pictorial, partially block diagram of a printed circuit board with integrated circuit chips mounted thereon and ESD protected.

In FIG. 31 a printed circuit card or printed wiring board 1711 has a card connector 1713 with conductors for inputs I, outputs O, a first power supply voltage V and a second power supply voltage such as a ground reference (e.g. 0 volts). The conductors provide printed wiring including line 1721 for voltage V and line 1723 for ground. Line 1721 is connected to dirty VDD and clean VDD terminals (VDD1 and VDD2) of an integrated circuit 1731 such as a microprocessor for instance. Line 1723 is connected to dirty VSS and clean VSS (VSS1 and VSS2) of IC 1731. In a similar manner lines 1721 and 1723 are connected to power supply terminals of integrated circuit chips 1741, 1743, 1745 and 1747, such as memory chips for instance.

When the printed circuit card 1711 of FIG. 31 is disconnected from an application system, a zap Z may strike any of the conductors such as supply conductor for voltage V or ground, or an input I or an output O. Advantageously, the integrated circuit chips 1731 and 1741–1747 are improved with ESD protection circuitry as described herein so that the internal circuitry is undamaged.

FIGS. 32–37 show circuit applications. It is contemplated that these and other circuit applications are improved with ESD protection circuits and methods as disclosed herein. For further circuit, device and system information see coassigned patent application Ser. No. 590,106 filed Sep. 28, 1990 (TI-14610) which is hereby incorporated herein by reference. FIGS. 32–37 correspond to FIGS. 17, 14, 1, 33, 19, and 29 in the incorporated application. Numerals in FIGS. 32–37 correspond to the numerals in the corresponding figures of the incorporated application and not to the numerals of the figures elsewhere herein.

Figure 32:
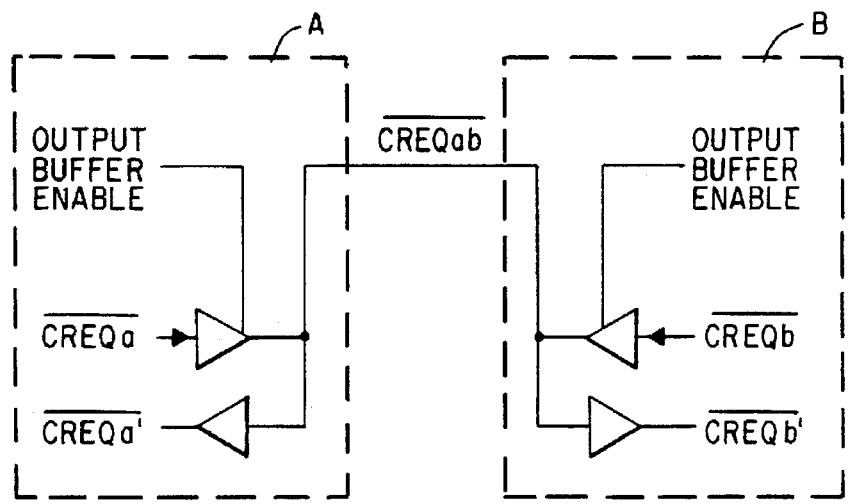
FIG. 32 is a schematic diagram of interconnected buffer circuits to which ESD protection is applied in two connected microcomputers.

FIG. 32 shows output buffers and input buffers for communication between two processors A and B. These buffers are improved for ESD protection. Referring to FIG. 32, internal signals applied to a buffer with a suffix 'a' or 'b' relate to a processor A or B that are connected together, to communicate signal CREQab-, for example. The external signal designation concatenates the suffixes. The value that a processor sees by sampling the output pad is denoted with a prime ('). All signals are buffered and can be placed in a high impedance state. See coassigned incorporated U.S. Pat. No. 4,928,023 for background description of a buffer circuit.

Figure 33:
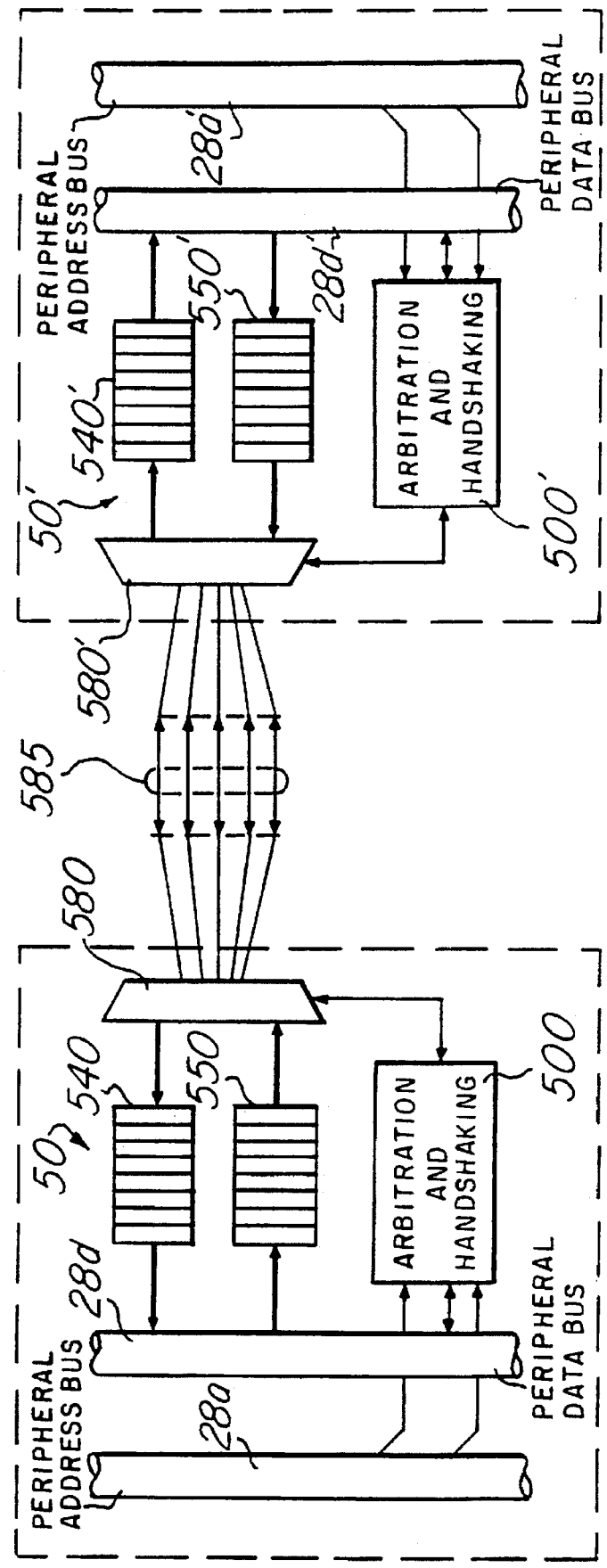
FIG. 33 is an electrical block diagram of interconnected communication ports to which ESD protection is applied in two connected microcomputers.

FIG. 33 illustrates the connection between two microcomputers 10 where one communication port is connected to another communication port in the other processor via control and data signals 585. When two microcomputers 10 are coupled via the communication ports, input and output FIFO registers 540 and 550 are coupled and the number of intercommunicating FIFO registers is doubled. The two microcomputers suitably have pin for pin compatibility so that they can be directly connected via any one of six communication ports 50–55. Circuit 500 provides arbitration and handshaking.

Figure 34:
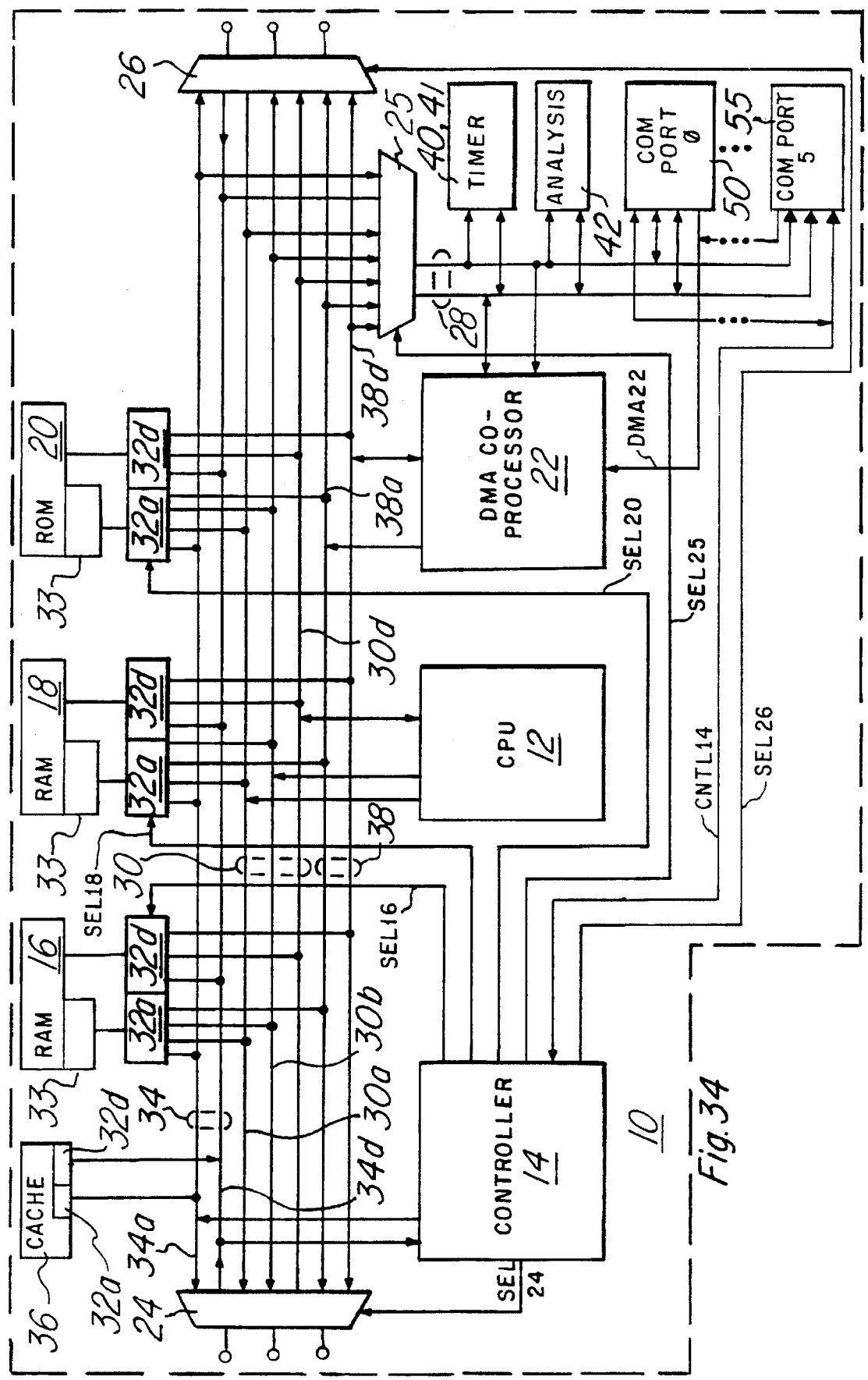
FIG. 34 is an electrical block diagram of one of the microcomputers to which ESD protection is applied.

In FIG. 34, an architecture is shown for an example microcomputer to which are applied the ESD improvements described herein. Microcomputer 10 has a central processing unit 12, a controller 14, and a direct memory access (DMA) coprocessor 22. Random access memories (RAMs) 16 and 18 and a read-only memory (ROM) 20 are provided and protected. External connection is made by way of peripheral ports 24 and 26, which multiplex various bus signals onto external terminals of microcomputer 10 and which provide special purpose signals for communication to external devices which are to receive and send data via the external terminals. Data bus 30 contains a set of data lines 30$d$ which communicate data signals among memories 16, 18 and 20, peripheral ports 24, 25 and 26 and CPU 12. Bus 30 contains 32 address lines in each of sets 30$a$ and 30$b$ which are also connected among CPU 12, peripheral ports 24, 25 and 26 and memories 16, 18 and 20.

Instruction cache 36 is a small high speed memory which retains most recently used instruction codes, so that when external memory devices are used for program storage, the retrieval of repetitively used instructions is effected at substantially the same rate as from the on-board memories.

ESD protection as described herein is applied to any or all of the various pins of integrated circuit 10, thereby protecting RAM and ROM memories, CPU, DMA, communication ports, power supply connections and circuits, clock circuitry, controller and peripheral ports.

Figure 35:
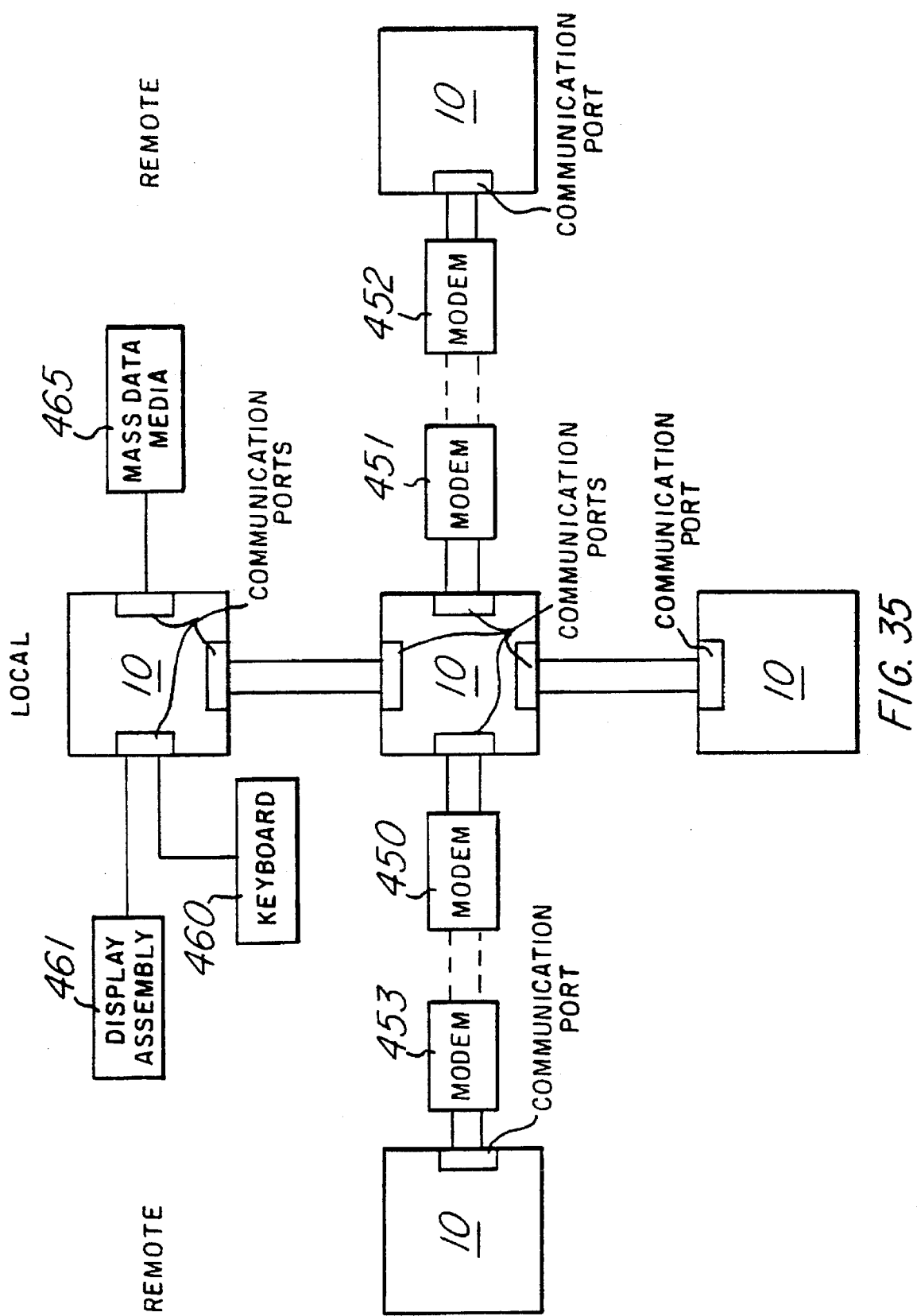
FIGS. 35–37 are electrical block diagrams of systems having computers and peripheral devices to which ESD protection is applied.

FIG. 35 illustrates a parallel processing system where some remote microcomputers 10 are connected via modem link 450, 451, 452 and 453 to their respective communication ports in the set 50–55 while other local microcomputers 10 are connected directly via other communication ports in the set 50–55. Keyboard 460, display assembly 461 and mass data media 465 are connected to local microcomputer 10 via communication ports.

Figure 36:
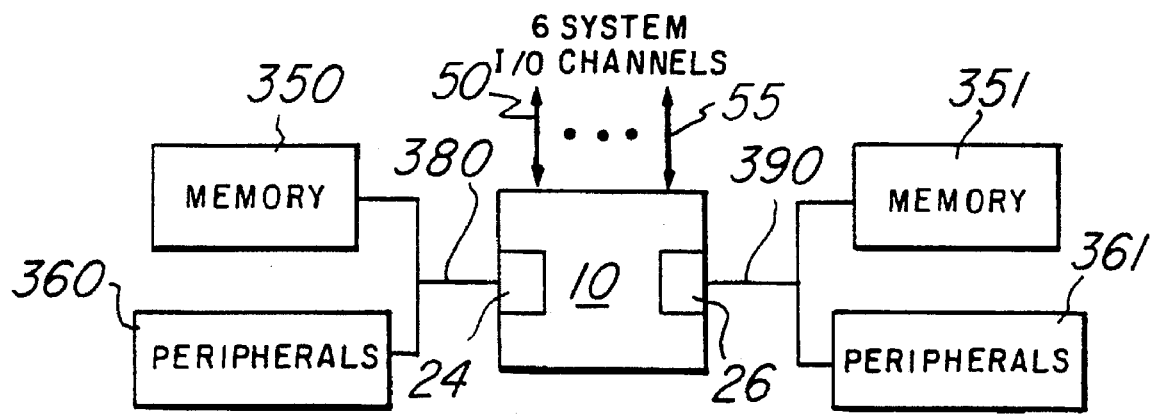

FIG. 36 shows an embodiment of a stand alone configuration of a data processing system improved with ESD protection and having a ESD protected integrated circuit 10 connected to a plurality of ESD protected memories, 350 and 351, and peripheral devices 360 and 361 all having integrated circuits improved with ESD protection according to the various ESD circuits described herein. Global peripheral port 24 and local peripheral port 26 of integrated circuit 10 have buffers and provide an interface to the external devices. For example, bus 380 can be used for program accesses and bus 390 can be concurrently used for data or I/O accesses.

Integrated circuit 10 as a microcomputer suitably has available six communications channels with additional buffers interfacing to other systems in I/O intensive applications. Peripherals and other external devices such as keyboards, monitors, disk drives, printers, displays, transducers, modems, other processors, local area networks (LANs), and other known or hereafter devised apparatus with which the system commends its use can be connected to the peripheral ports 24 and 26 and communication ports 50–55. Any or all of the integrated circuits in any one, some, or all of these devices and apparatus are suitably improved with ESD protection as described herein. The integrated circuits of FIGS. 35–37 are suitably interconnected on one or more circuit cards such as that of FIG. 31, for instance.

Figure 37:
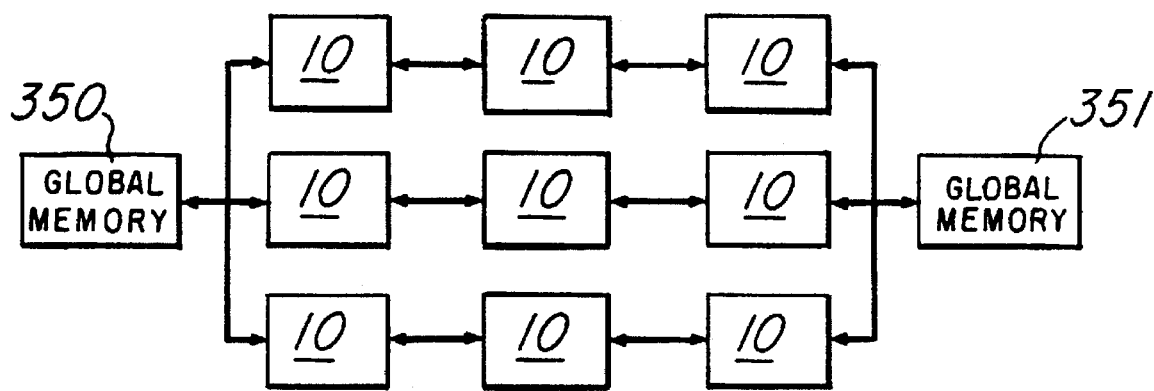

FIG. 37 shows another embodiment of a parallel processing system architecture configuration combining shared memories 350 and 351 and microcomputers 10 intercommunicating. All of these chips are suitably improved with ESD protection as described herein.

Returning to internal construction of an integrated circuit, the Texas Instruments Third-Generation TMS320 User's Guide, 1988, pp. 2—2 to 2-5 shows tables of pins of an advanced digital signal processor chip. This chip has four 5 volt supply pins VDD(3–0), two 5 volt supply pins IODVDD(1,0), two 5 volt supply pins ADVDD(1,0), one 5 volt supply pin PDVDD, two 5 volt supply pins DDVDD (1,0), and one 5 volt supply pin MDVDD. The ground pins are four pins VSS(3–0), four pins DVSS(3–0), two ground pins CVSS(1,0) and one ground pin IVSS. A substrate pin SUBS can be tied to ground.

Figure 38:
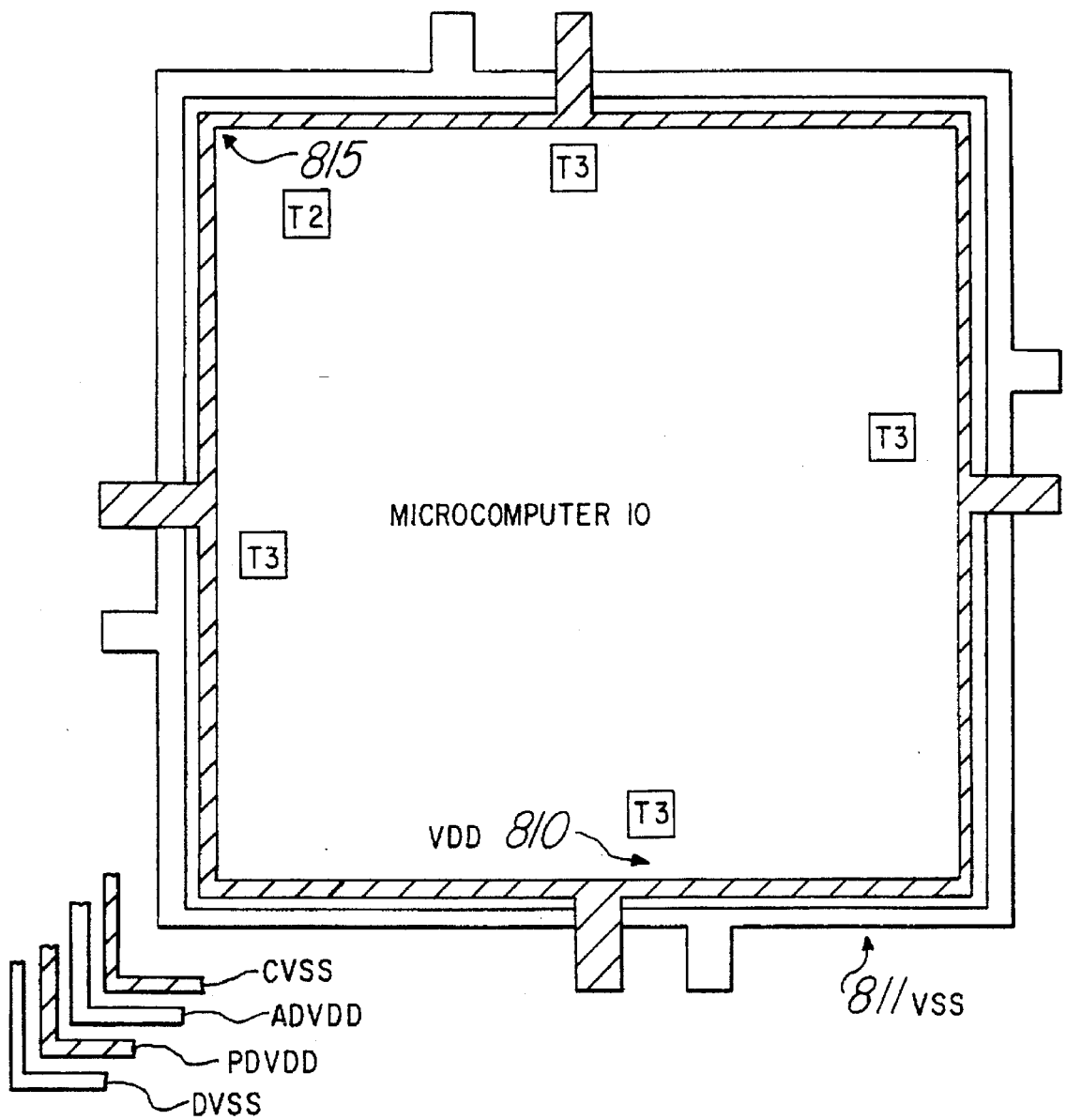
FIG. 38 is a microscopic plan view of voltage supply conductors of an integrated circuit combined with ESD protection circuits.

FIG. 38 shows a layout of two of six or more concentric rings of power supply conductors on-chip. The four VDD pins go to bond pads that connect centrally on each of the four sides of a conductor 810. The four VSS pins go to bond pads that connect centrally on each of the four sides of a conductor 811. Additional concentric conductors (partially shown) in outward order are CVSS, ADVDD, PDVDD, and DVSS. This arrangement is further improved to form an ESD protected layout structure with SCRs, transistors, single and cascaded, diodes and other ESD semiconductor structures as described herein combined with conductors that are closed, unbroken, continuous loops, rectangles, squares or other such power supply conductors that extend around the chip and have symmetrical, low inductance geometry. The power supply pads connecting to any one such closed loop are preferably connected and located approximately equidistant from one another on the loop. For example, transistor T3 is preferably located where VDD1 and VSS1 are close together, such as near the middle of each side. Transistor T2 of FIGS. 1 and 2 is preferably located near a corner 815 in one embodiment at a point close to both VDDL and DVDD pads for low impedance. SCRs are located near each input pad and each output pad on the chip. In this way a zap efficiently reaches each ESD circuit for dissipation thereat instead of some less preferable circuit destination.

A few preferred embodiments have been described in detail hereinabove. It is to be understood that the scope of the invention also comprehends embodiments different from those described, yet within the scope of the claims.

"Microcomputer" in some contexts is used to mean that microcomputer requires a memory and "microprocessor" does not. The usage herein is that these terms can also be synonymous and refer to equivalent things. The phrase "processing circuitry" comprehends ASICs (application specific integrated circuits), PAL (programmable array logic), PLAs (programmable logic arrays), decoders, memories, non-software based processors, or other circuitry, or digital computers including microprocessors and microcomputers of any architecture, or combinations thereof. Words of inclusion are to be interpreted as nonexhaustive in considering the scope of the invention.

Internal and external connections can be ohmic, capacitive, direct or indirect, via intervening circuits or otherwise. Elements of p or n conductivity type can be changed to the other type with voltage reversed in polarity. Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware. Process diagrams are also representative of flow diagrams for microcoded and software based embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:

a semiconductor substrate having a first conductivity type with bond pads for different supply voltages and concentric conductive closed loops on said semiconductor chip connected to said bond pads;

a network of transistors and diodes connected to said concentric conductive closed loops to dissipate electrostatic discharges;

a signal bond pad for receiving a signal and an SCR circuit connected between said signal bond pad and said substrate operative to conduct electrostatic discharges to said substrate;

a plurality of series connected resisters and field effect transistors having one end of each of said plurality of resistors connected to said SCR circuit for triggering said SCR circuit;

wherein said SCR circuit and plurality of series connected resistors and field effect transistors formed on said substrate further comprise;

a tank region having a second conductivity type;

a first heavily doped region having said second conductivity type disposed at least partly in said tank region;

a second heavily doped region having said first conductivity type disposed within said tank region;

a third heavily doped region having said second conductivity type spaced apart from said tank region;

a fourth heavily doped region having said second conductivity type spaced apart from said third heavily doped region opposite from said tank region;

a fifth heavily doped region having said second conductivity type spaced apart from said tank region symmetrically with said third region; and a sixth heavily doped region having said second conductivity type spaced apart from said fifth heavily doped region opposite from said tank region symmetrically with said fourth region.

2. The integrated circuit of claim 1 further comprising:

a first resistor connected between said fourth region and said signal bond pad; and a second resistor connected between said sixth region and said signal bond pad.

3. The integrated circuit of claim 1 further comprising:

a first resistor connected between said fourth region and said tank region; and a second resistor connected between said sixth region and said tank region.

4. The integrated circuit of claim 1 wherein:

said fifth heavily doped region is symmetrical with said third heavily doped region about an axis through approximately the center of said tank region; and said sixth heavily doped region is symmetrical with said third heavily doped region about said axis.

5. The integrated circuit of claim 4 wherein:

said third, fourth, fifth and sixth heavily doped regions are approximately rectangular in shape and approximately parallel with each other and said axis and are each spaced apart from said tank region by a first distance.

6. The integrated circuit of claim 5 wherein said first distance is less than 5 microns.

7. The integrated circuit of claim 4 wherein:

said third, fourth, fifth and sixth heavily doped regions are approximately rectangular in shape and approximately perpendicular with said axis such that said third region and said fifth region are adjacent to said tank region.

8. The integrated circuit of claim 1 wherein:

said fifth heavily doped region is spaced apart from said fourth heavily doped region opposite from said tank region.

9. The integrated circuit of claim 1 further comprising:

a first gate disposed generally between and overlying a portion of said third heavily doped region and said fourth heavily doped region; and a second gate disposed generally between and overlying a portion of said fifth heavily doped region and said sixth heavily doped region.

10. The integrated circuit of claim 1 further comprising:

a first gate disposed generally between and overlying a portion of said third heavily doped region and said fourth heavily doped region;

a second gate disposed generally between and overlying a portion of said fourth heavily doped region and said fifth heavily doped region;

a third gate disposed generally between and overlying a portion of said fifth heavily doped region and said sixth heavily doped region; and wherein said first, second and third gates are connected together.

11. A circuit having an SCR and a plurality of devices for triggering said SCR disposed on a substrate having a first conductivity type comprising:

a tank region having a second conductivity type;

a first heavily doped region having said second conductivity type disposed at least partly in said tank region;

a second heavily doped region having said first conductivity type disposed within said tank region;

a third heavily doped region having said second conductivity type spaced apart from said tank region;

a fourth heavily doped region having said second conductivity type spaced apart from said third heavily doped region;

a fifth heavily doped region having said second conductivity type spaced apart from said tank region, said fifth heavily doped region is symmetrical with said third heavily doped region about an axis through approximately the center of said tank region; and a sixth heavily doped region having said second conductivity type spaced apart from said fifth heavily doped region, said sixth heavily doped region is symmetrical with said third heavily doped region about said axis.

12. The integrated circuit of claim 11 further comprising:

a first resister connected between said fourth region and a bond pad; and a second resistor connected between said sixth region and said bond pad.

13. The integrated circuit of claim 11 further comprising:

a first resistor connected between said fourth region and said tank region; and a second resistor connected between said sixth region and said tank region.

14. The integrated circuit of claim 11 wherein:

said third, fourth, fifth and sixth heavily doped regions are approximately rectangular in shape and approximately parallel with each other and said axis and are each spaced apart from said tank region by a first distance.

15. The integrated circuit of claim 14 wherein said first distance is less than 5 microns.

16. The integrated circuit of claim 11 wherein:

said third, fourth, fifth and sixth heavily doped regions are approximately rectangular in shape and approximately perpendicular with said axis such that said third region and said fifth region are adjacent to said tank region, said fifth heavily doped region is spaced apart from said fourth heavily doped region opposite from said tank region.

17. The integrated circuit of claim 11 wherein:

said fifth heavily doped region is spaced apart from said fourth heavily doped region opposite from said tank region.

18. The integrated circuit of claim 11 further comprising:

a first gate disposed generally between and overlying a portion of said third heavily doped region and said fourth heavily doped region; and a second gate disposed generally between and overlying a portion of said fifth heavily doped region and said sixth heavily doped region.

19. The integrated circuit of claim 14 further comprising:

a first gate disposed generally between and overlying a portion of said third heavily doped region and said fourth heavily doped region;

a second gate disposed generally between and overlying a portion of said fourth heavily doped region and said fifth heavily doped region;

a third gate disposed generally between and overlying a portion of said fifth heavily doped region and said sixth heavily doped region; and wherein said first, second and third gates are connected together.

* * * * *